United States Patent
Kijima

(10) Patent No.: US 10,854,808 B2
(45) Date of Patent: Dec. 1, 2020

(54) FERROELECTRIC CERAMICS, ELECTRONIC COMPONENT AND MANUFACTURING METHOD OF FERROELECTRIC CERAMICS

(71) Applicant: Advanced Material Technologies, Inc., Chiba (JP)

(72) Inventor: Takeshi Kijima, Chiba (JP)

(73) Assignee: ADVANCED MATERIAL TECHNOLOGIES, INC., Chiba (JP)

( * ) Notice: Subject to any disclaimer, the term of this patent is extended or adjusted under 35 U.S.C. 154(b) by 767 days.

(21) Appl. No.: 14/886,138

(22) Filed: Oct. 19, 2015

(65) Prior Publication Data
US 2016/0118574 A1    Apr. 28, 2016

(30) Foreign Application Priority Data

Oct. 23, 2014  (JP) .................. 2014-216012

(51) Int. Cl.
C23C 14/35        (2006.01)
H01L 41/187       (2006.01)
(Continued)

(52) U.S. Cl.
CPC ........ H01L 41/1876 (2013.01); C23C 14/025 (2013.01); C23C 14/088 (2013.01);
(Continued)

(58) Field of Classification Search
CPC . H01L 41/1876; H01L 41/318; C23C 14/566; C23C 28/042; C23C 14/025; C23C 14/568; C23C 14/35; C23C 14/088
See application file for complete search history.

(56) References Cited

U.S. PATENT DOCUMENTS

| 8,866,367 B2 * | 10/2014 | Fox ................. C30B 23/02 310/357 |
| 2013/0192878 A1 * | 8/2013 | Kijima ............... H01L 41/39 174/250 |
| 2013/0258549 A1 * | 10/2013 | Noguchi .............. H01G 4/018 361/311 |

FOREIGN PATENT DOCUMENTS

| JP | 2001-196652 | 7/2001 |
| JP | 2007-42983 | 2/2007 |

(Continued)

OTHER PUBLICATIONS

Bastani et al., "Enhanced dielectric and piezoelectric response in PZT superlattice-like films by leveraging spontaneous Zr/Ti gradient formation", Acta Materialia, vol. 60 (2012) 1346-1352. (Year: 2012).*

(Continued)

Primary Examiner — Jonathan C Langman
(74) Attorney, Agent, or Firm — Wenderoth, Lind & Ponack, L.L.P.

(57) ABSTRACT

Ferroelectric ceramics including: a $Pb(Zr_{1-B}Ti_B)O_3$ seed crystal film formed on a foundation film; and a $Pb(Zr_{1-x}Ti_x)O_3$ crystal film, wherein: the seed crystal film is formed by sputtering while the foundation film is being disposed on an upper side of a sputtering target and the foundation film is being made to face the sputtering target; in the seed crystal film, a Zr/Ti ratio on the crystal film side from the center in the thickness direction thereof is larger than a Zr/Ti ratio on the foundation film side from the center in the thickness direction thereof; the crystal film is crystallized by coating and heating a solution containing, in an organic solvent, a metal compound wholly or partially containing ingredient metals of the crystal film and a partial polycondensation product thereof; and the B and the x satisfy formulae 2 and 3, respectively, below, $0.1 < B < 1$   formula 2

$0.1 < x < 1$   formula 3.

11 Claims, 14 Drawing Sheets

PZT FILM STRUCTURE

| PZT50/50 | 240nm |
| PZT55/45 | 240nm |
| PZT60/40 | 240nm |
| PZT65/35 | 240nm |
| PZT70/30 | 240nm |
| SPT-PZT(58/42) | 100nm |

(51) Int. Cl.
*C23C 14/08* (2006.01)
*H01L 41/318* (2013.01)
*C23C 14/56* (2006.01)
*C23C 28/04* (2006.01)
*C23C 14/02* (2006.01)

(52) U.S. Cl.
CPC ............ *C23C 14/35* (2013.01); *C23C 14/566* (2013.01); *C23C 14/568* (2013.01); *C23C 28/042* (2013.01); *H01L 41/318* (2013.01)

(56) References Cited

FOREIGN PATENT DOCUMENTS

| | | |
|---|---|---|
| JP | 2011-80132 | 4/2011 |
| JP | 2013-251490 | 12/2013 |
| JP | WO2016009698 * | 1/2016 .......... H01L 41/319 |
| WO | 2006/087777 | 8/2006 |
| WO | 2012/124409 | 9/2012 |

OTHER PUBLICATIONS

Boldyreva et al.. "Ferroelectric/Antiferroelectric Pb(Zr0.8Ti0.2)O3/PbZrO3 Epitaxial Multilayers: Growth and Thickness-Dependent Properties", Ferroelectrics, vol. 370, 2008, pp. 140-146. (Year: 2008).*

ZKhaenamkaew et al, "Microstructure and ferroelectric properties of sol-gel graded PZT (40/52/60)", Ceramics International, vol. 34, 2008, pp. 1027-1030. (Year: 2008).*

Alkoy et al., "Improving fatigue resistance of Pb(Zr,Ti)O3 thin films by using PbZrO3 buffer layers", Journal of Applied Physics, vol. 99, 2006, p. 106106-1-106106-3. (Year: 2006).*

* cited by examiner

FIG. 3A
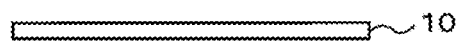
FIG. 3B
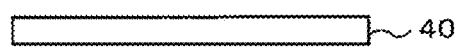

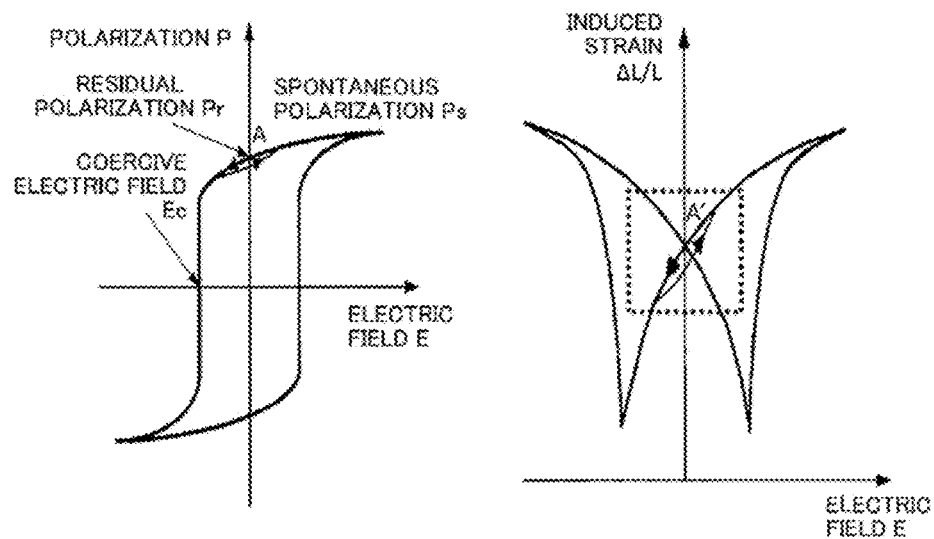

FIG. 15
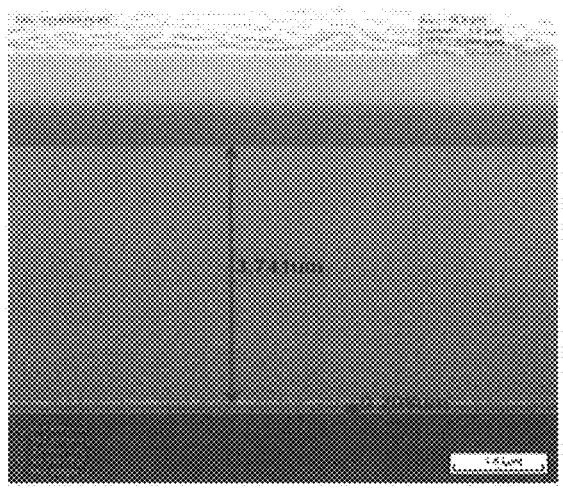
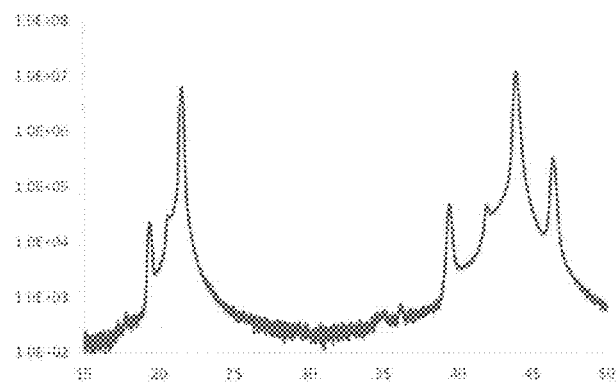
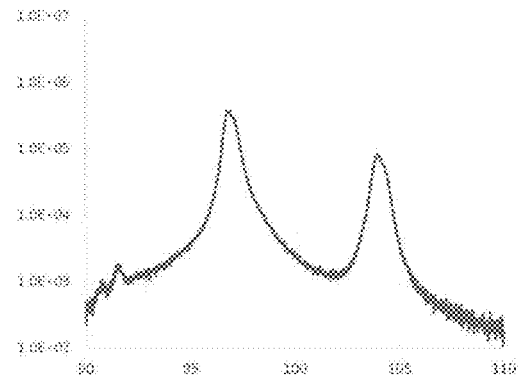

COMPOSITION IS 55/45 IN FILM AVERAGE
Zr>Ti  WEIGHT
Zr<Ti  VAPOR PRESSURE
Zr<Ti  MELTING POINT, BOILING POINT
→ COMPOSITION GRADIENT IS REVERSED

FERROELECTRIC CERAMICS, ELECTRONIC COMPONENT AND MANUFACTURING METHOD OF FERROELECTRIC CERAMICS

BACKGROUND OF THE INVENTION

Field of the Invention

The present invention relates to ferroelectric ceramics, an electronic component and a manufacturing method of ferroelectric ceramics.

Description of a Related Art

A conventional manufacturing method of a Pb(Zr, Ti)O$_3$ (hereinafter, referred to as "PZT") perovskite-type ferroelectric ceramics will be explained.

A SiO$_2$ film having a thickness of 300 nm is formed on a 4-inch Si wafer, and a TiO$_x$ film having a thickness of 5 nm is formed on the SiO$_2$ film. Next, for example, a Pt film having a thickness of 150 nm, oriented to (111), is formed on the TiO$_x$ film, and a PZT sol-gel solution is spin-coated on the Pt film by using a spin coater. Under spin conditions at this time, the wafer is rotated at a rotation rate of 1500 rpm for 30 seconds and is rotated at a rotation rate of 4000 rpm for 10 seconds.

Next, the coated PZT sol-gel solution is heated and held on a hot plate at 250° C. for 30 seconds to thereby be dried, and moisture is removed, and, after that, the resultant substance is additionally heated and held on a hot plate maintained at a high temperature of 500° C. for 60 seconds, with the result that temporal calcination is performed. A PZT amorphous film having a thickness of 150 nm is generated by repeating this for several times.

Subsequently, an annealing treatment is performed on the PZT amorphous film at 700° C. by using a pressurizing-type lamp annealing device (RTA: rapidly thermal anneal) to thereby carry out PZT crystallization. The PZT film thus crystallized is constituted of a perovskite structure (refer to, for example, Patent Literature 1).

PATENT DOCUMENT

[Patent Literature 1] WO 2006/087777

SUMMARY OF THE INVENTION

Problems to be Solved by the Invention

An aspect of the present invention is to enhance piezoelectric properties.

In addition, an aspect of the present invention is to make a polarization direction of a Pb(Zr$_{1-B}$Ti$_B$)O$_3$ seed crystal film formed by sputtering be identical to the polarization direction of a Pb(Zr$_{1-x}$Ti$_x$)O$_3$ crystal film formed by a sol-gel method.

Means to Solve the Problems

Hereinafter, various aspects of the present invention will be explained.

[1] Ferroelectric ceramics including:

a Pb(Zr$_{1-B}$Ti$_B$)O$_3$ seed crystal film formed on a foundation film; and a Pb(Zr$_{1-x}$Ti$_x$)O$_3$ crystal film formed on the Pb(Zr$_{1-B}$Ti$_B$)O$_3$ seed crystal film, wherein:

the Pb(Zr$_{1-B}$Ti$_B$)O$_3$ seed crystal film is formed by sputtering while the foundation film is being disposed on an upper side of a sputtering target and the foundation film is being made to face the sputtering target;

in the Pb(Zr$_{1-B}$Ti$_B$)O$_3$ seed crystal film, a Zr/Ti ratio on the Pb(Zr$_{1-x}$Ti$_x$)O$_3$ crystal film side from the center in the thickness direction thereof is larger than a Zr/Ti ratio on the foundation film side from the center in the thickness direction thereof;

the Pb(Zr$_{1-x}$Ti$_x$)O$_3$ crystal film is crystallized by coating and heating a solution containing, in an organic solvent, a metal compound wholly or partially containing ingredient metals of the Pb(Zr$_{1-x}$Ti$_x$)O$_3$ crystal film and a partial polycondensation product thereof; and the B and the x satisfy formulae 2 and 3, respectively, below, $0.1 < B < 1$   formula 2

$0.1 < x < 1$   formula 3.

[2] Ferroelectric ceramics including:

a Pb(Zr$_{1-B}$Ti$_B$)O$_3$ seed crystal film formed, by sputtering, on a foundation film; and a Pb(Zr$_{1-x}$Ti$_x$)O$_3$ crystal film formed on the Pb(Zr$_{1-B}$Ti$_B$)O$_3$ seed crystal film, wherein:

the Pb(Zr$_{1-x}$Ti$_x$)O$_3$ crystal film is crystallized by coating and heating a solution containing, in an organic solvent, a metal compound wholly or partially containing ingredient metals of the Pb(Zr$_{1-x}$Ti$_x$)O$_3$ crystal film and a partial polycondensation product thereof;

in the Pb(Zr$_{1-x}$Ti$_x$)O$_3$ crystal film, a Zr/Ti ratio on the Pb(Zr$_{1-B}$Ti$_B$)O$_3$ seed crystal film side from the center in the thickness direction thereof is larger than a Zr/Ti ratio on a side opposite to the Pb(Zr$_{1-B}$Ti$_B$)O$_3$ seed crystal film from the center in the thickness direction thereof; and the B and the x satisfy formulae 2 and 3, respectively, below, $0.1 < B < 1$   formula 2

$0.1 < x < 1$   formula 3.

[3] The ferroelectric ceramics according to [2], wherein:

the Pb(Zr$_{1-B}$Ti$_B$)O$_3$ seed crystal film is formed by sputtering while the foundation film is being disposed on an upper side of a sputtering target and the foundation film is being made to face the sputtering target; and in the Pb(Zr$_{1-B}$Ti$_B$)O$_3$ seed crystal film, a Zr/Ti ratio on the Pb(Zr$_{1-x}$Ti$_x$)O$_3$ crystal film side from the center in the thickness direction thereof is larger than a Zr/Ti ratio on the foundation film side from the center in the thickness direction thereof.

[3-1] The ferroelectric ceramics according to any one of [1] to [3], wherein a Zr/Ti ratio in the Pb(Zr$_{1-B}$Ti$_B$)O$_3$ seed crystal film becomes larger in order of a region from the foundation film to 1/3 in the thickness direction thereof, a region from the foundation film to 1/3 to 2/3 in the thickness direction thereof, and a region from the foundation film to 2/3 to 3/3 in the thickness direction thereof.

[3-2] The ferroelectric ceramics according to any one of [1] to [3], and [3-1], wherein a Zr/Ti ratio in the Pb(Zr$_{1-x}$Ti$_x$)O$_3$ crystal film becomes smaller in order of a region from the Pb(Zr$_{1-B}$Ti$_B$)O$_3$ seed crystal film to 1/3 in the thickness direction thereof, a region from the Pb(Zr$_{1-B}$Ti$_B$)O$_3$ seed crystal film to 1/3 to 2/3 in the thickness direction thereof, and a region from the Pb(Zr$_{1-B}$Ti$_B$)O$_3$ seed crystal film to 2/3 to 3/3 in the thickness direction thereof.

[4] The ferroelectric ceramics according to any one of [2], [3], [3-1] and [3-2], wherein a Zr/Ti ratio in the Pb(Zr$_{1-x}$Ti$_x$)

$O_3$ crystal film in the thickness direction thereof becomes gradually smaller with increase in distance from the $Pb(Zr_{1-B}Ti_B)O_3$ seed crystal film.

[5] The ferroelectric ceramics according to any one of [1], [3], [3-1] and [3-2], wherein a Zr/Ti ratio in the Pb $(Zr_{1-B}Ti_B)O_3$ seed crystal film in the thickness direction thereof becomes gradually larger with increase in distance from the foundation film toward the $Pb(Zr_{1-x}Ti_x)O_3$ crystal film.

[6] Ferroelectric ceramics including:
a $Pb(Zr_{1-A}Ti_A)O_3$ film;
a $Pb(Zr_{1-B}Ti_B)O_3$ seed crystal film formed, by sputtering, on the $Pb(Zr_{1-A}Ti_A)O_3$ film; and
a $Pb(Zr_{1-x}Ti_x)O_3$ crystal film formed on the $Pb(Zr_{1-B}Ti_B)O_3$ seed crystal film, wherein:
the $Pb(Zr_{1-x}Ti_x)O_3$ crystal film is crystallized by coating and heating a solution containing, in an organic solvent, a metal compound wholly or partially containing ingredient metals of the $Pb(Zr_{1-x}Ti_x)O_3$ crystal film and a partial polycondensation product thereof;
the A, the B and the x satisfy formulae 1 to 3, respectively; and
a ratio of Zr to Ti in the whole of the $Pb(Zr_{1-A}Ti_A)O_3$ film, the $Pb(Zr_{1-B}Ti_B)O_3$ seed crystal film and the $Pb(Zr_{1-x}Ti_x)O_3$ crystal film satisfies formula 4 below, $$0 \leq A \leq 0.1 \quad \text{formula 1}$$

$$0.1 < B < 1 \quad \text{formula 2}$$

$$0.1 < x < 1 \quad \text{formula 3}$$

$$60/40 \leq Zr/Ti \leq 80/20 \quad \text{formula 4.}$$

[7] The ferroelectric ceramics according to [6], wherein:
the $Pb(Zr_{1-B}Ti_B)O_3$ seed crystal film is formed by sputtering while the $Pb(Zr_{1-A}Ti_A)O_3$ film is being disposed on an upper side of a sputtering target and the $Pb(Zr_{1-A}Ti_A)O_3$ film is being made to face the sputtering target; and
in the $Pb(Zr_{1-B}Ti_B)O_3$ seed crystal film, a Zr/Ti ratio on the $Pb(Zr_{1-x}Ti_x)O_3$ crystal film side from the center in the thickness direction thereof is larger than a Zr/Ti ratio on the $Pb(Zr_{1-A}Ti_A)O_3$ film side from the center in the thickness direction thereof.

[8] The ferroelectric ceramics according to any one of [1], [6] and [7], wherein, in the $Pb(Zr_{1-x}Ti_x)O_3$ crystal film, a Zr/Ti ratio on the $Pb(Zr_{1-B}Ti_B)O_3$ seed crystal film side from the center in the thickness direction thereof is larger than a Zr/Ti ratio on the side opposite to the $Pb(Zr_{1-B}Ti_B)O_3$ seed crystal film from the center in the thickness direction thereof.

[8-1] The ferroelectric ceramics according to any one of [6] to [8], wherein a Zr/Ti ratio in the $Pb(Zr_{1-B}Ti_B)O_3$ seed crystal film becomes larger in order of a region from the $Pb(Zr_{1-A}Ti_A)O_3$ film to 1/3 in the thickness direction thereof, a region from the $Pb(Zr_{1-A}Ti_A)O_3$ film to 1/3 to 2/3 in the thickness direction thereof, and a region from the Pb $(Zr_{1-A}Ti_A)O_3$ film to 2/3 to 3/3 in the thickness direction thereof.

[8-2] The ferroelectric ceramics according to any one of [6] to [8], and [8-1], wherein a Zr/Ti ratio in the Pb $(Zr_{1-x}Ti_x)O_3$ crystal film becomes smaller in order of a region from the $Pb(Zr_{1-B}Ti_B)O_3$ seed crystal film to 1/3 in the thickness direction thereof, a region from the Pb $(Zr_{1-B}Ti_B)O_3$ seed crystal film to 1/3 to 2/3 in the thickness direction thereof, and a region from the $Pb(Zr_{1-B}Ti_B)O_3$ seed crystal film to 2/3 to 3/3 in the thickness direction thereof.

[9] The ferroelectric ceramics according to any one of [8], [8-1] and [8-2], wherein a Zr/Ti ratio in the $Pb(Zr_{1-x}Ti_x)O_3$ crystal film in the thickness direction thereof becomes gradually smaller with increase in distance from the Pb $(Zr_{1-B}Ti_B)O_3$ seed crystal film.

[10] The ferroelectric ceramics according to any one of [7], [8-1] and [8-2], wherein a Zr/Ti ratio in the Pb $(Zr_{1-B}Ti_B)O_3$ seed crystal film in the thickness direction thereof becomes gradually larger with increase in distance from the $Pb(Zr_{1-A}Ti_A)O_3$ film toward the $Pb(Zr_{1-x}Ti_x)O_3$ crystal film.

[11] The ferroelectric ceramics according to any one of [1] to [3], [3-1], [3-2], [4] to [8], [8-1], [8-2], [9] and [10], wherein a ratio of Zr to Ti in the whole of the $Pb(Zr_{1-B}Ti_B)$ $O_3$ seed crystal film and the $Pb(Zr_{1-x}Ti_x)O_3$ crystal film satisfies a formula 6 below, $$52/48 \leq Zr/Ti \quad \text{formula 6.}$$

[12] The ferroelectric ceramics according to any one of [1] to [3], [3-1], [3-2], [4] to [8], [8-1], [8-2], and [9] to [11], wherein the B and the x satisfy a formula 2' and a formula 3', respectively, below, $$0.4 \leq B \leq 0.6 \quad \text{formula 2'}$$

$$0.4 \leq x \leq 0.6 \quad \text{formula 3'.}$$

[13] The ferroelectric ceramics according to [6] or [7], wherein:
the A is 0; and
the $Pb(Zr_{1-A}Ti_A)O_3$ film is a $PbZrO_3$ film.

[14] The ferroelectric ceramics according to any one of [1] to [3], [3-1], [3-2], [4] to [8], [8-1], [8-2], and [9] to [13], wherein the $Pb(Zr_{1-x}Ti_x)O_3$ crystal film is oriented to the same plane as a plane in the $Pb(Zr_{1-B}Ti_B)O_3$ seed crystal film.

[15] The ferroelectric ceramics according to any one of [1] to [3], [3-1], [3-2], [4] to [8], [8-1], [8-2], and [9] to [14], wherein a ratio of Pb to (Zr+Ti) in each of the $Pb(Zr_{1-B}Ti_B)$ $O_3$ seed crystal film and the $Pb(Zr_{1-x}Ti_x)O_3$ crystal film satisfies formula 5 below, $$Pb/(Zr+Ti) < 1.06 \quad \text{formula 5.}$$

[16] The ferroelectric ceramics according to any one of [1] to [3], [3-1], [3-2], [4] to [8], [8-1], [8-2], and [9] to [15], wherein:
the $Pb(Zr_{1-B}Ti_B)O_3$ seed crystal film is oriented to (001); and
the $Pb(Zr_{1-x}Ti_x)O_3$ crystal film is oriented to (001).

[17] The ferroelectric ceramics according to any one of [1] to [3], [3-1], [3-2], [4] to [8], [8-1], [8-2], and [9] to [16], wherein:
the $Pb(Zr_{1-B}Ti_B)O_3$ seed crystal film is oriented to (111); and
the $Pb(Zr_{1-x}Ti_x)O_3$ crystal film is oriented to (111).

[17-1] The ferroelectric ceramics according to any one of [6], [7] and [13], wherein the $Pb(Zr_{1-A}Ti_A)O_3$ film is formed on an oxide film.

[17-2] The ferroelectric ceramics according to [17-1], wherein the oxide film is a $Sr(Ti, Ru)O_3$ film.

[17-3] The ferroelectric ceramics according to any one of [6], [7], [13], [17-1] and [17-2], wherein the $Pb(Zr_{1-A}Ti_A)O_3$ film is formed on an electrode film.

[17-4] The ferroelectric ceramics according to [17-3], wherein the electrode film is composed of an oxide or a metal.

[17-5] The ferroelectric ceramics according to [17-3] or [17-4], wherein the electrode film is a Pt film or an Ir film.

[17-6] The ferroelectric ceramics according to any one of [17-3], [17-4] and [17-5], wherein the electrode film is formed on a $ZrO_2$ film.

[17-7] The ferroelectric ceramics according to any one of [17-3], [17-4], [17-5] and [17-6], wherein the electrode film is formed on a Si substrate.

[18] An electronic component having ferroelectric ceramics according to any one of [1] to [3], [3-1], [3-2], [4] to [8], [8-1], [8-2], [9] to [17], [17-1], [17-2], [17-3], [17-4], [17-5], [17-6] and [17-7].

[19] A manufacturing method of ferroelectric ceramics, including the steps of:

forming a $Pb(Zr_{1-B}Ti_B)O_3$ seed crystal film, by sputtering, on a substrate;

coating a solution containing a metal compound wholly or partially containing, in an organic solvent, ingredient metals of the $Pb(Zr_{1-B}Ti_B)O_3$ seed crystal film and a partial polycondensation product thereof onto the $Pb(Zr_{1-B}Ti_B)O_3$ seed crystal film to thereby form a noncrystalline precursor film; and heating the $Pb(Zr_{1-B}Ti_B)O_3$ seed crystal film and the noncrystalline precursor film in an oxygen atmosphere to thereby oxidize and crystallize the noncrystalline precursor film and to thereby form a $Pb(Zr_{1-x}Ti_x)O_3$ crystal film, wherein:

formation of the $Pb(Zr_{1-B}Ti_B)O_3$ seed crystal film is performed by sputtering while the substrate is being disposed on an upper side of a sputtering target and the substrate is being made to face the sputtering target; and the B and the x satisfy formula 2 and formula 3, respectively, below, $$0.1 < B < 1 \qquad \text{formula 2}$$

$$0.1 < x < 1 \qquad \text{formula 3.}$$

[20] The manufacturing method of ferroelectric ceramics according to [19], wherein a polarization direction of the $Pb(Zr_{1-B}Ti_B)O_3$ seed crystal film immediately after forming the $Pb(Zr_{1-B}Ti_B)O_3$ seed crystal film by sputtering is identical to a polarization direction of a $Pb(Zr_{1-x}Ti_x)O_3$ crystal film immediately after forming the $Pb(Zr_{1-x}Ti_x)O_3$ crystal film by oxidizing and crystallizing the noncrystalline precursor film.

Note that, in the present specification, "polarization directions are identical" includes the meaning that, in addition to the meaning that the directions are completely identical, the directions are identical in that the substrate side of a Pb $(Zr_{1-B}Ti_B)O_3$ seed crystal film is negatively polarized and the side of the $Pb(Zr_{1-B}Ti_B)O_3$ seed crystal film opposite to the substrate is positively polarized and the substrate side of the $Pb(Zr_{1-x}Ti_x)O_3$ crystal film is negatively polarized and the side of $Pb(Zr_{1-x}Ti_x)O_3$ crystal film opposite to the substrate is positively polarized. (limitation of Zr/Ti ratio of solution in thickness direction)

[21] The manufacturing method of ferroelectric ceramics according to [19] or [20], wherein:

the noncrystalline precursor film is formed by coating a plurality of times the solutions on the $Pb(Zr_{1-B}Ti_B)O_3$ seed crystal film; and in the solutions that are coated the plurality of times, a Zr/Ti ratio in a solution that is coated onto the $Pb(Zr_{1-B}Ti_B)O_3$ seed crystal film from the center of the noncrystalline precursor film in the thickness direction is larger than a Zr/Ti ratio in a solution that is coated onto the side opposite to the $Pb(Zr_{1-B}Ti_B)O_3$ seed crystal film from the center of the noncrystalline precursor film in the thickness direction.

[21-1] The manufacturing method of ferroelectric ceramics according to any one of [19] to [21], wherein:

the noncrystalline precursor film is formed by coating a plurality of times the solution onto the $Pb(Zr_{1-B}Ti_B)O_3$ seed crystal film; and a Zr/Ti ratio in each of the solutions to be coated the plurality of times becomes smaller in order of a region from the $Pb(Zr_{1-B}Ti_B)O_3$ seed crystal film to 1/3 in the thickness direction of the noncrystalline precursor film, a region from the $Pb(Zr_{1-B}Ti_B)O_3$ seed crystal film to 1/3 to 2/3 in the thickness direction thereof, and a region from the $Pb(Zr_{1-B}Ti_B)O_3$ seed crystal film to 2/3 to 3/3 in the thickness direction thereof.

[22] The manufacturing method of ferroelectric ceramics according to any one of [19] to [21], and [21-1], wherein, in the $Pb(Zr_{1-x}Ti_x)O_3$ crystal film, a Zr/Ti ratio on the $Pb(Zr_{1-B}Ti_B)O_3$ seed crystal film side from the center in the thickness direction thereof is larger than a Zr/Ti ratio on the side opposite to the $Pb(Zr_{1-B}Ti_B)O_3$ seed crystal film from the center in the thickness direction thereof.

[23] The manufacturing method of ferroelectric ceramics according to any one of [19] to [21], [21-1] and [22], wherein, in the $Pb(Zr_{1-B}Ti_B)O_3$ seed crystal film, a Zr/Ti ratio on the $Pb(Zr_{1-x}Ti_x)O_3$ crystal film side from the center in the thickness direction thereof is larger than a Zr/Ti ratio on the foundation film side from the center in the thickness direction thereof.

[23-1] The manufacturing method of ferroelectric ceramics according to any one of [19] to [21], [21-1], [22] and [23], wherein a Zr/Ti ratio in the $Pb(Zr_{1-B}Ti_B)O_3$ seed crystal film becomes larger in order of a region from the substrate side to 1/3 in the thickness direction thereof, a region from the substrate side to 1/3 to 2/3 in the thickness direction thereof, and a region from the substrate side to 2/3 to 3/3 in the thickness direction thereof.

[23-2] The manufacturing method of ferroelectric ceramics according to any one of [19] to [21], [21-1], [22], [23] and [23-1], wherein a Zr/Ti ratio in the $Pb(Zr_{1-x}Ti_x)O_3$ crystal film becomes smaller in order of a region from the $Pb(Zr_{1-B}Ti_B)O_3$ seed crystal film to 1/3 in the thickness direction thereof, a region from the $Pb(Zr_{1-B}Ti_B)O_3$ seed crystal film to 1/3 to 2/3 in the thickness direction thereof, and a region from the $Pb(Zr_{1-B}Ti_B)O_3$ seed crystal film to 2/3 to 3/3 in the thickness direction thereof.

[24] The manufacturing method of ferroelectric ceramics according to [21] or [21-1], wherein, in the solutions that are coated the plurality of times, a Zr/Ti ratio in each of the solutions for the noncrystalline precursor film in the thickness direction thereof becomes gradually smaller with increase in distance from the $Pb(Zr_{1-B}Ti_B)O_3$ seed crystal film.

[25] The manufacturing method of ferroelectric ceramics according to [22], wherein a Zr/Ti ratio in the $Pb(Zr_{1-x}Ti_x)O_3$ crystal film in the thickness direction thereof becomes gradually smaller with increase in distance from the $Pb(Zr_{1-B}Ti_B)O_3$ seed crystal film.

[26] The manufacturing method of ferroelectric ceramics according to any one of [23], [23-1] and [23-2], wherein a Zr/Ti ratio in the $Pb(Zr_{1-B}Ti_B)O_3$ seed crystal film in the thickness direction thereof becomes gradually larger with increase in distance from the substrate toward the $Pb(Zr_{1-x}Ti_x)O_3$ crystal film.

[27] The manufacturing method of ferroelectric ceramics according to any one of [19] to [21], [21-1], [22], [23], [23-1], [23-2], and [24] to [26], wherein the $Pb(Zr_{1-x}Ti_x)O_3$ crystal film is oriented to the same plane as a plane in the $Pb(Zr_{1-B}Ti_B)O_3$ seed crystal film.

[28] The manufacturing method of ferroelectric ceramics according to any one of [19] to [21], [21-1], [22], [23], [23-1], [23-2], and [24] to [27], wherein:

the substrate has a $Pb(Zr_{1-A}Ti_A)O_3$ film, and the $Pb(Zr_{1-B}Ti_B)O_3$ seed crystal film is formed on the $Pb(Zr_{1-A}Ti_A)O_3$ film;

the A satisfies a formula 1 below; and a ratio of Zr to Ti in the whole of the $Pb(Zr_{1-A}Ti_A)O_3$ film, the $Pb(Zr_{1-B}Ti_B)O_3$ seed crystal film and the $Pb(Zr_{1-x}Ti_x)O_3$ crystal film satisfies a formula 4 below, $$0 \leq A \leq 0.1 \quad \text{formula 1}$$

$$60/40 \leq Zr/Ti \leq 80/20 \quad \text{formula 4.}$$

[29] The manufacturing method of ferroelectric ceramics according to [28], wherein the B and the x satisfy formula 2' and formula 3', respectively, below, $$0.4 \leq B \leq 0.6 \quad \text{formula 2'}$$

$$0.4 \leq x \leq 0.6 \quad \text{formula 3'}.$$

[29-1] The manufacturing method of ferroelectric ceramics according to [28] or [29], wherein the $Pb(Zr_{1-A}Ti_A)O_3$ film is formed by a sputtering method, and the sputtering method forms the film by epitaxial growth while disposing the substrate on an upper side of a sputtering target and making the substrate face the sputtering target.

[29-2] The manufacturing method of ferroelectric ceramics according to [28] or [29], wherein the $Pb(Zr_{1-A}Ti_A)O_3$ film is formed by coating a precursor solution of $Pb(Zr_{1-A}Ti_A)O_3$ onto a substrate, and performing crystallization in an oxygen atmosphere of 5 atm or more.

[30] The manufacturing method of ferroelectric ceramics according to anyone of [28], [29], [29-1] and [29-2], wherein:

the A is 0; and the $Pb(Zr_{1-A}Ti_A)O_3$ film is a $PbZrO_3$ film.

[31] The manufacturing method of ferroelectric ceramics according to any one of [19] to [21], [21-1], [22], [23], [23-1], [23-2], [24] to [29], [29-1], [29-2] and [30], wherein a ratio of Pb to (Zr+Ti) in each of the $Pb(Zr_{1-B}Ti_B)O_3$ seed crystal film and the $Pb(Zr_{1-x}Ti_x)O_3$ crystal film satisfies a formula 5 below, $$Pb/(Zr+Ti)<1.06 \quad \text{formula 5.}$$

[31-1] The manufacturing method of ferroelectric ceramics according to any one of [19] to [21], [21-1], [22], [23], [23-1], [23-2], [24] to [29], [29-1], [29-2], [30] and [31], wherein:

the $Pb(Zr_{1-B}Ti_B)O_3$ seed crystal film is oriented to (001); and the $Pb(Zr_{1-x}Ti_x)O_3$ crystal film is oriented to (001).

[31-2] The manufacturing method of ferroelectric ceramics according to any one of [19] to [21], [21-1], [22], [23], [23-1], [23-2], [24] to [29], [29-1], [29-2], [30] and [31], wherein:

the $Pb(Zr_{1-B}Ti_B)O_3$ seed crystal film is oriented to (111); and the $Pb(Zr_{1-x}Ti_x)O_3$ crystal film is oriented to (111)

[32] A manufacturing apparatus of ferroelectric ceramics, including:

a first apparatus that forms a $Pb(Zr_{1-B}Ti_B)O_3$ seed crystal film by sputtering on a substrate;

a second apparatus that forms, as a noncrystalline precursor film by a spin-coating method, a solution containing, in an organic solvent, a metal compound containing wholly or partially ingredient metals of the $Pb(Zr_{1-B}Ti_B)O_3$ seed crystal film and a partial polycondensation product thereof onto the $Pb(Zr_{1-B}Ti_B)O_3$ seed crystal film; and a third apparatus that oxidizes and crystallizes the noncrystalline precursor film by heating the $Pb(Zr_{1-B}Ti_B)O_3$ seed crystal film and the noncrystalline precursor film in an oxygen atmosphere, to thereby form a $Pb(Zr_{1-x}Ti_x)O_3$ crystal film, wherein:

the first apparatus is an apparatus that performs film formation by sputtering while disposing the substrate on an upper side of a sputtering target and making the substrate face the sputtering target; and the B and the x satisfy formula 2 and formula 3 below, $$0.1<B<1 \quad \text{formula 2}$$

$$0.1<x<1 \quad \text{formula 3.}$$

[33] The manufacturing apparatus of ferroelectric ceramics according to [32], wherein a polarization direction of the $Pb(Zr_{1-B}Ti_B)O_3$ seed crystal film immediately after forming the $Pb(Zr_{1-B}Ti_B)O_3$ seed crystal film by the first apparatus is identical to the polarization direction of the $Pb(Zr_{1-x}Ti_x)O_3$ crystal film immediately after forming the $Pb(Zr_{1-x}Ti_x)O_3$ crystal film by the third apparatus.

Effects of the Invention

Piezoelectric properties can be enhanced by applying an aspect of the present invention.

Furthermore, a polarization direction of a $Pb(Zr_{1-B}Ti_B)O_3$ seed crystal film formed by sputtering can be made identical to the polarization direction of a $Pb(Zr_{1-x}Ti_x)O_3$ crystal film formed by a sol-gel method, by applying an aspect of the present invention.

BRIEF DESCRIPTION OF THE DRAWINGS

FIG. 3A is a schematic view showing a positional relationship between a substrate 10 and a sputtering target 40 in a fourth sputtering apparatus of deposition-up shown in FIGS. 2, and 3B is a schematic view showing a positional relationship between a substrate and a sputtering target in a sputtering apparatus of deposition-down in Comparative Example.

FIG. 9 is a cross-sectional view showing a structure of a PZT film of a Sample 1 in Example 1 and a Sample 2 in Comparative Example.

FIGS. 10A and 10B are drawings showing relationship of polarization (P) and electric field-induced strain (ΔL/L)

relative to electric field (E) in a sample in Example 1, as a conceptual view of a ferroelectric substance PZT thin film.

Figure 11:
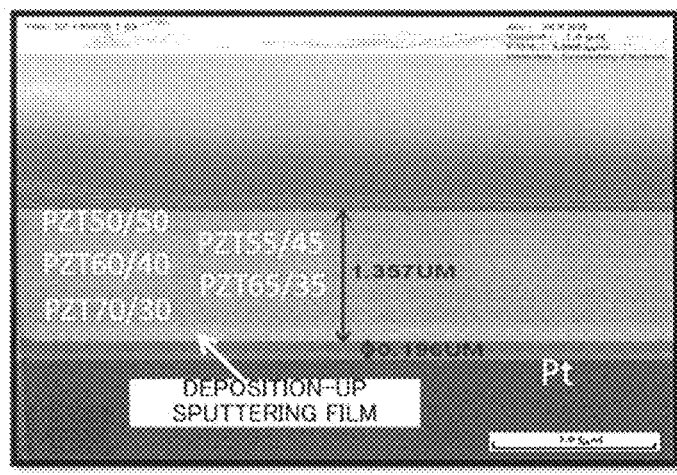

FIG. 11 is a cross-sectional image of a FIB film of the Sample 1 in Example 1.

Figure 12A:
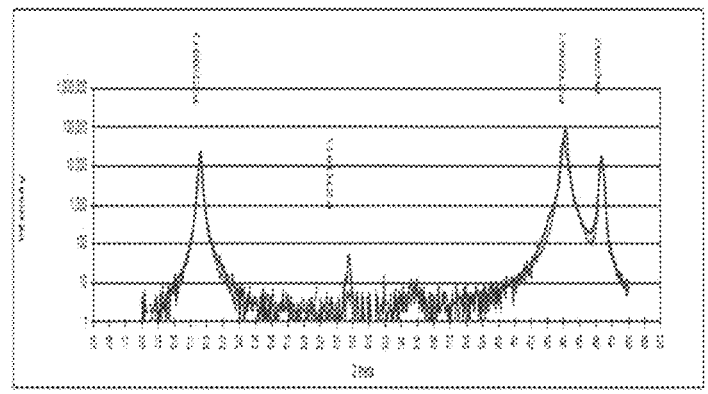

FIG. 12A is a chart showing an XRD pattern of the Sample 1 in Example 1, and 12B is a chart showing an XRD pattern of the Sample 2 in Comparative Example.

Figure 13:
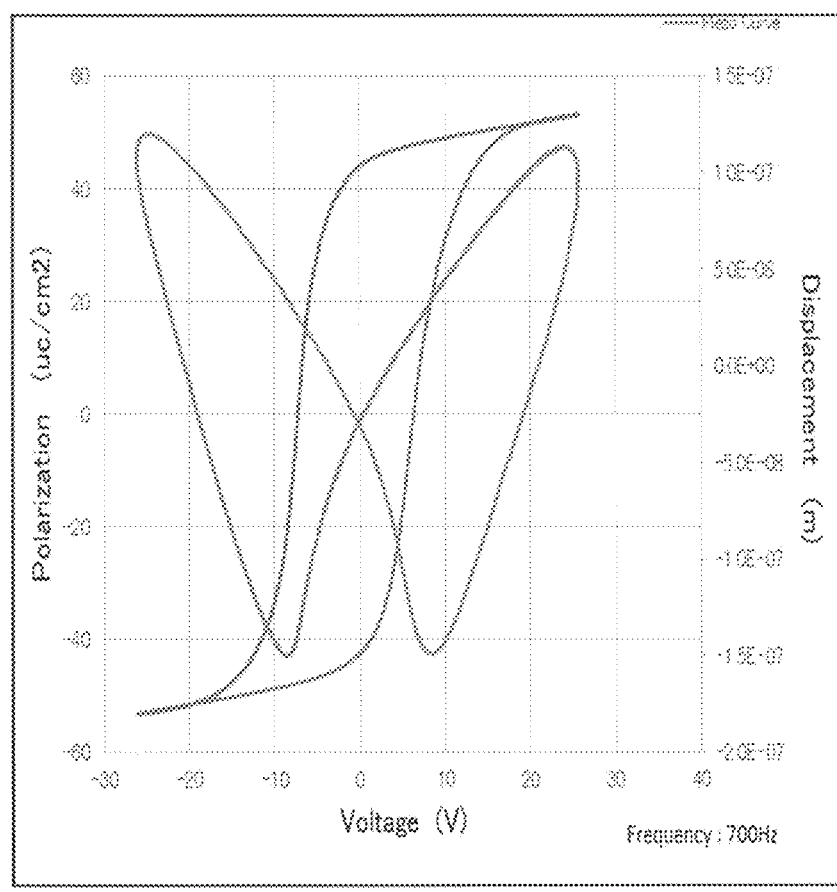

FIG. 13 is a drawing showing a D-E hysteresis curve and a piezoelectric butterfly property of the PZT thin film of the Sample 1 in Example 1.

Figure 14A:
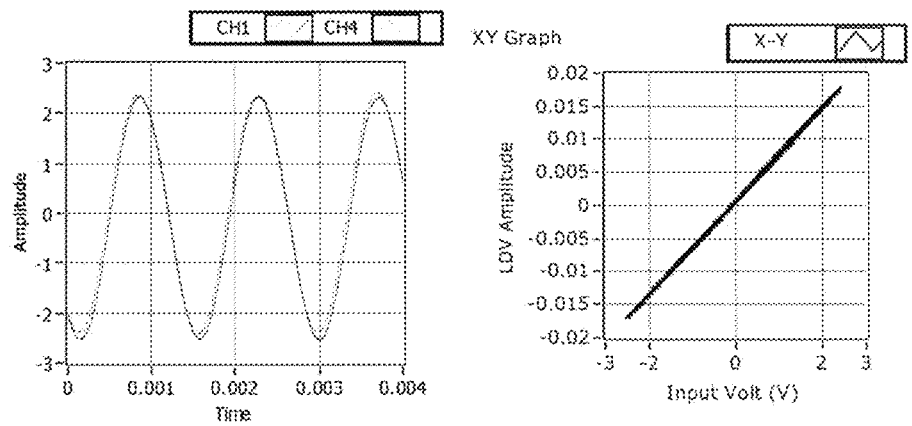

FIG. 14A shows drawings of a piezoelectric current property and a piezoelectric hysteresis property of the Sample 1 in Example 1, and 14B shows drawings of a piezoelectric current property and a piezoelectric hysteresis property of the Sample 2 in Comparative Example.

FIG. 15 shows a cross-sectional image of an FIB film of a Sample 3 in Example 2 and charts of the XRD pattern of the Sample 3.

Figure 16A:
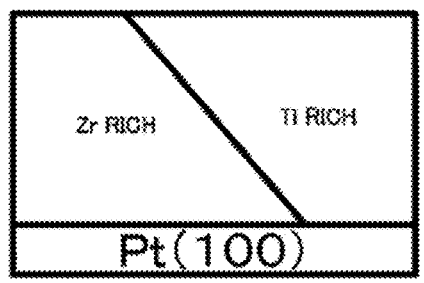

FIG. 16A is a drawing schematically showing composition of a PZT film formed by a sputtering method of deposition-down on a Pt film oriented to (100), 16B is a drawing schematically showing a composition of a PZT film formed by a sputtering method of deposition-up on a Pt film oriented to (100), and 16C is a drawing schematically showing Ti vapor, Zr vapor and Pb vapor in a sputtering chamber.

DESCRIPTION OF THE PREFERRED EMBODIMENTS

Hereinafter, embodiments of the present invention will be explained in detail using the drawings. However, a person skilled in the art would easily understand that the present invention is not limited to the following explanation, but forms and details thereof can be variously modified without deviating from the purport and the scope of the present invention. Accordingly, the present invention is not to be construed as being limited to description of the embodiments shown below.

First Embodiment

Figure 1:
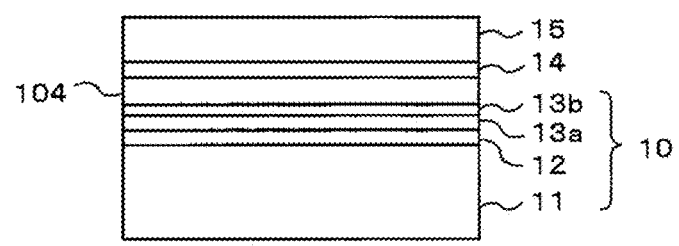
FIG. 1 is a schematic cross-sectional view for explaining a manufacturing method of ferroelectric ceramics according to an aspect of the present invention.
Figure 2:
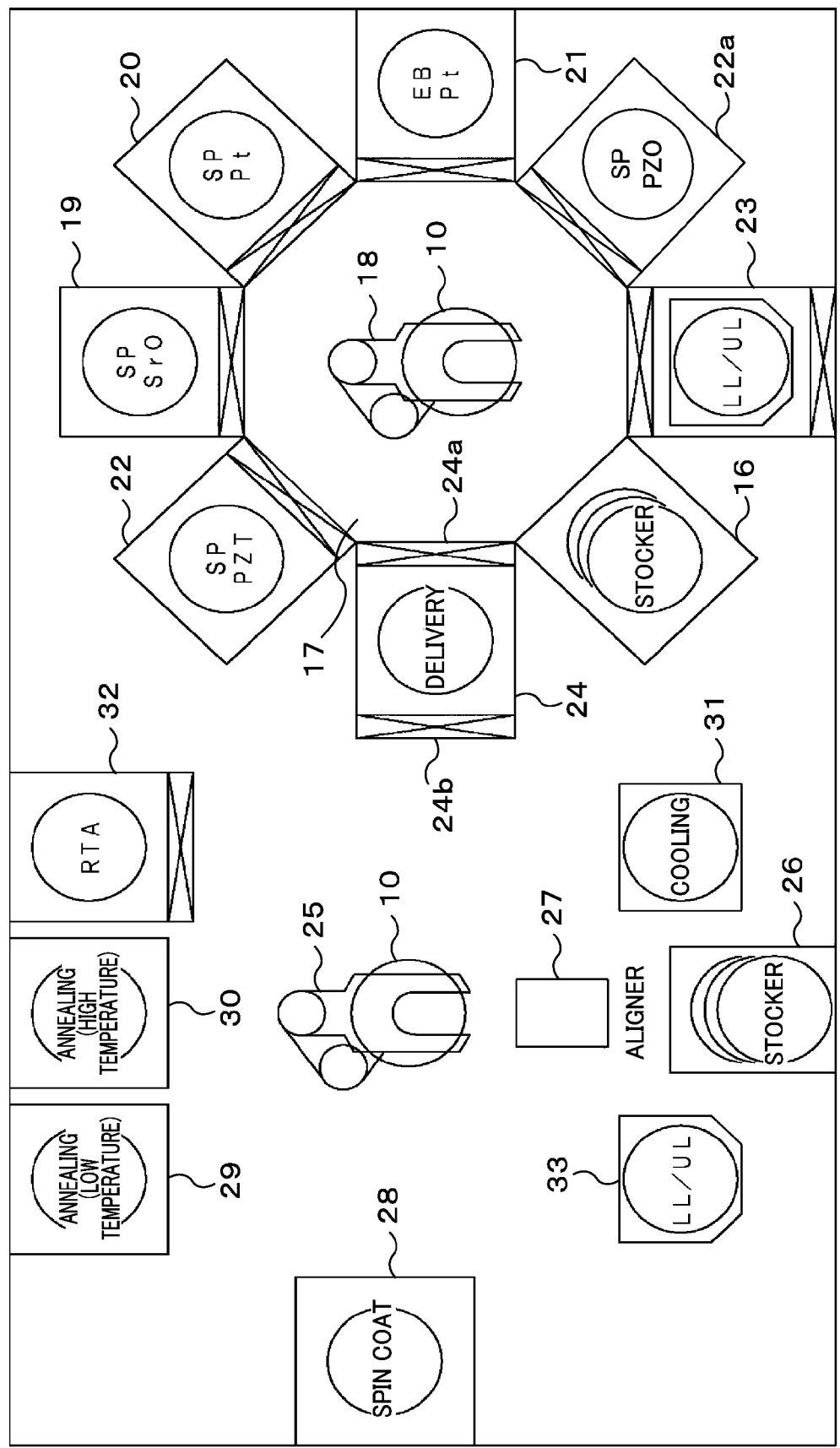
FIG. 2 is a configuration diagram schematically showing a manufacturing apparatus of ferroelectric ceramics according to an aspect of the present invention.

FIG. 1 is a schematic cross-sectional view for explaining a manufacturing method of ferroelectric ceramics according to an aspect of the present invention. FIG. 2 is a configuration diagram schematically showing a manufacturing apparatus of ferroelectric ceramics according to an aspect of the present invention. The manufacturing apparatus of ferroelectric ceramics is a composite film formation apparatus for forming a ferroelectric substance capacitor.

First, a substrate 10 is prepared.

In detail, a silicon wafer 11 is introduced into a loading/unloading room 23 shown in FIG. 2 from the outside of the apparatus, and the silicon wafer 11 in the loading/unloading room 23 is conveyed to a stocker 16 through a conveyance chamber 17 by using a conveyance robot (conveyance mechanism) 18. Next, the silicon wafer 11 in the stocker 16 is conveyed to an electron beam vapor deposition apparatus 21 through the conveyance chamber 17 by using the conveyance robot 18. Subsequently, an oxide film is formed on the silicon wafer 11 by the electron beam vapor deposition apparatus 21. Continuously, a film 12 is obtained by forming a Pt film oriented to (100). Then, the silicon wafer 11 in the electron beam vapor deposition apparatus 21 is conveyed to a first sputtering apparatus 20 through the conveyance chamber 17 by using the conveyance robot 18. After that, a Pt film 13a oriented to (100) is formed on a Pt film by using the first sputtering apparatus 20. Next, the silicon wafer 11 in the first sputtering apparatus 20 is conveyed to a second sputtering apparatus 19 through the conveyance chamber 17 by using the conveyance robot 18. Subsequently, a SrRuO₃ film 13b oriented to (001) is formed on the Pt film 13a oriented to (100) by using the second sputtering apparatus 19.

Next, the substrate 10 in the second sputtering apparatus 19 is conveyed to a third sputtering apparatus 22a through the conveyance chamber 17 by using a conveyance robot 18. Next, a PbZrO₃ film (hereinafter, also referred to as a "PZO film") 104 is formed on the SrRuO₃ film 13b of the substrate 10, by epitaxial growth through sputtering by using the third sputtering apparatus 22a.

Note that, the lattice constant of PZO is a=8.232 Å, b=11.776 Å and c=5.882 Å. The a axis length is about twice that of average perovskite (ap≈4 Å), the c axis length is c≈(√2)ap, and the b axis length is b≈2c. The change in the lattice constant of PZO is fundamentally caused to give a period twice in the b axis direction by the rotation of a perovskite octahedron crystal and by the addition of strain of an octahedron to the rotation.

Figure 4:
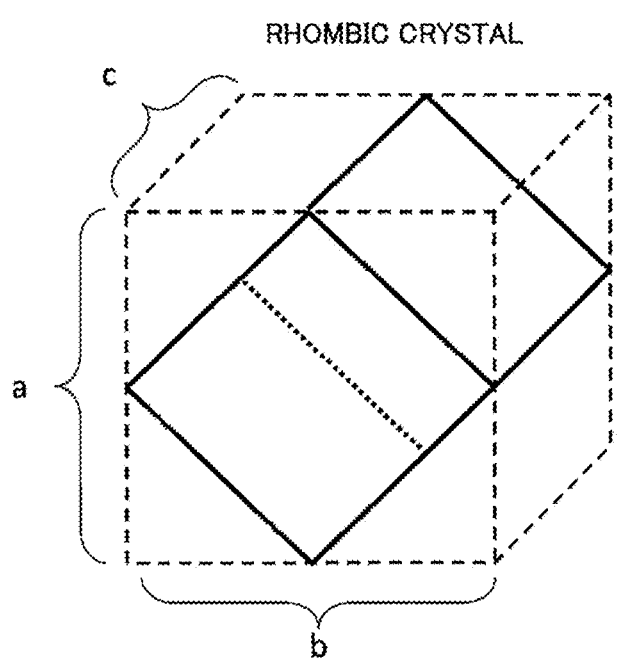
FIG. 4 is a drawing showing that PZO has a crystal structure of a rhombic crystal.

As shown in FIG. 4, PZO is a rhombic crystal. Consequently, PZO apparently has a large lattice constant. This is because perovskite vertically rotates by approximately 45 degrees and is treated as if perovskite is a large crystal by surrounding the circumstance of the rotated crystal as a part shown by dotted lines. Namely, it is customary for a rhombic crystal to be treated as if lengths of a, b and c axes become apparently very long. Actual PZO is a crystal shown by solid lines and is an ordinary perovskite crystal.

Furthermore, in the present specification, the "PZO film" also includes a film containing impurities in PbZrO₃, and various substances may be contained as long as the impurities do not extinguish the function of the PZO film even when the impurities are contained.

Next, the substrate 10 in the third sputtering apparatus 22a is conveyed to a fourth sputtering apparatus 22 through the conveyance chamber 17 by using the conveyance robot 18. Next, by the fourth sputtering apparatus 22, a Pb(Zr$_{1-B}$Ti$_B$)O₃ seed crystal film 14 is formed by epitaxial growth on the PZO film 104 of the substrate 10 through a sputtering method. In the sputtering method at this time, film formation is carried out while a magnetic field is being applied to a sputtering target and the substrate 10 is being rotated.

The fourth sputtering apparatus 22 is, as shown in FIG. 3A, an apparatus that forms a PZO film 104 by epitaxial growth through a sputtering method, while disposing the substrate 10 on the upper side of a sputtering target 40 and making the PZO film 104 on the substrate 10 face the sputtering target 40. Namely, the sputtering method is a so-so-called sputtering method of deposition-up, in which the sputtering target 40 is disposed on the lower side of the substrate 10 to thereby form a sputtering film on the substrate 10 positioned on the upper side of the sputtering target 40. When forming the Pb(Zr$_{1-B}$Ti$_B$)O₃ seed crystal film 14 by the sputtering method of deposition-up, the Ti composition in the Pb(Zr$_{1-B}$Ti$_B$)O₃ seed crystal film 14 is influenced by the gravity applied toward the lower side from the substrate 10 and the Ti amount becomes larger at a position closer to the substrate 10. As a result, the substrate 10 side of the Pb(Zr$_{1-B}$Ti$_B$)O₃ seed crystal film 14 is negatively polarized, and the side of the Pb(Zr$_{1-B}$Ti$_B$)O₃ seed crystal film 14 opposite to the substrate 10 is positively polarized. The polarization direction is identical to the polarization direction of a Pb(Zr$_{1-x}$Ti$_x$)O₃ crystal film formed by a sol-gel method to be described later. It becomes unnecessary to be subjected to polling processing by setting the polarization direction to be identical as described above, and thus a manufacturing process can be reduced.

Here, for comparison, there is considered an example of forming a $Pb(Zr_{1-B}Ti_B)O_3$ seed crystal film by a so-called sputtering method of deposition-down, in which a film is formed while the substrate 10 is being disposed on the lower side of the sputtering target 40 and the PZO film 104 is being made to face the sputtering target 40 as shown in FIG. 3B. In the sputtering method of deposition-down, the Zr composition in the $Pb(Zr_{1-B}Ti_B)O_3$ seed crystal film is influenced by the gravity applied toward the lower side from the sputtering target 40 and the Zr amount becomes larger at a position closer to the substrate 10. As a result, the substrate 10 side of the $Pb(Zr_{1-B}Ti_B)O_3$ seed crystal film is positively polarized, and the side of the $Pb(Zr_{1-B}Ti_B)O_3$ seed crystal film opposite to the substrate 10 is negatively polarized. The polarization direction is opposite to the polarization direction of a $Pb(Zr_{1-x}Ti_x)O_3$ crystal film formed by a sol-gel method to be described later. As described above, when the polarization direction is opposite, polling processing is required to be performed.

In the fourth sputtering apparatus 22, the substrate and the sputtering target 40 are disposed as shown in FIG. 3A. However, in the first to third sputtering apparatuses 20, 19 and 22a, the substrate 10 and the sputtering target may be disposed in deposition-down shown in FIG. 3B, or may be disposed in deposition-up shown in FIG. 3A. In the electron beam vapor deposition apparatus 21, the substrate 10 and an vapor deposition source may be disposed in deposition-down, or may be disposed in deposition-up. However, in the present embodiment, in the first to third sputtering apparatuses 20, 19 and 22a, the substrate 10 and the sputtering target are disposed in deposition-up shown in FIG. 3A, and, in the electron beam vapor deposition apparatus 21, the substrate 10 and the vapor deposition source are disposed in deposition-up.

In the $Pb(Zr_{1-B}Ti_B)O_3$ seed crystal film 14, a Zr/Ti ratio on the PZO film 104 side from the center in the thickness direction thereof is preferably smaller than a Zr/Ti ratio on the side opposite to the PZO film 104 from the center in the thickness direction thereof. More preferably, the Zr/Ti ratio in the $Pb(Zr_{1-B}Ti_B)O_3$ seed crystal film 14 becomes larger in order of a region from the PZO film 104 to 1/3 in the thickness direction thereof, a region from the PZO film 104 to 1/3 to 2/3 in the thickness direction thereof, and a region from the PZO film 104 to 2/3 to 3/3 in the thickness direction thereof.

B in the $Pb(Zr_{1-B}Ti_B)O_3$ seed crystal film 14 satisfies formula 2 below, and preferably satisfies formula 2' below.

$$0.1 < B < 1 \qquad \text{formula 2}$$

$$0.4 \le B \le 0.6 \qquad \text{formula 2'}$$

The ratio of Pb to (Zr+Ti) in the $Pb(Zr_{1-B}Ti_B)O_3$ seed crystal film 14 satisfies a formula 5 below, and preferably satisfies formula 5' below.

$$Pb/(Zr+Ti) < 1.06 \qquad \text{formula 5}$$

$$1 \le Pb/(Zr+Ti) < 1.06 \qquad \text{formula 5'}$$

The $Pb(Zr_{1-B}Ti_B)O_3$ seed crystal film 14 by the above-described epitaxial growth is singly oriented or preferentially oriented to either (001) or (111), and can form a crystal film having extremely excellent crystallinity.

Note that, in the present specification, the "$Pb(Zr_{1-B}Ti_B)O_3$ seed crystal film" also includes a film containing impurities in $Pb(Zr_{1-B}Ti_B)O_3$, and various substances may be contained as long as the impurities do not extinguish the function of the $Pb(Zr_{1-B}Ti_B)O_3$ seed crystal film even when the impurities are contained.

After that, a film is formed, on the $Pb(Zr_{1-B}Ti_B)O_3$ seed crystal film 14, as a noncrystalline precursor film by a method of coating (for example, a spin-coating method) a precursor solution containing, in an organic solvent, a metal compound wholly or partially containing ingredient metals of the $Pb(Zr_{1-B}Ti_B)O_3$ seed crystal film 14 and a partial polycondensation product thereof. Next, the noncrystalline precursor film is oxidized and crystallized, by heating the $Pb(Zr_{1-B}Ti_B)O_3$ seed crystal film 14 and the noncrystalline precursor film in an oxygen atmosphere, with the result that a $Pb(Zr_{1-x}Ti_x)O_3$ crystal film 15 is formed (refer to FIG. 1).

x in the $Pb(Zr_{1-x}Ti_x)O_3$ crystal film 15 satisfies formula 3 below, and preferably satisfies formula 3' below.

$$0.1 < x < 1 \qquad \text{formula 3}$$

$$0.4 \le x \le 0.6 \qquad \text{formula 3'}$$

Detailed explanation will be given below.

The substrate 10 in the fourth sputtering apparatus 22 is conveyed to the delivery chamber 24 through the conveyance chamber 17 by using the conveyance robot 18. Next, by reversing the front face and the rear face of the substrate 10 in the delivery chamber 24, the front face (film forming surface) of the substrate 10 is turned upward (direction opposite to the gravity direction). The reversing operation of the substrate in the delivery chamber 24 will be explained in detail while referring to FIGS. 5 to 7. FIGS. 5 to 7 are drawings showing details of operations in the delivery chamber shown in FIG. 2.

Figure 5A:
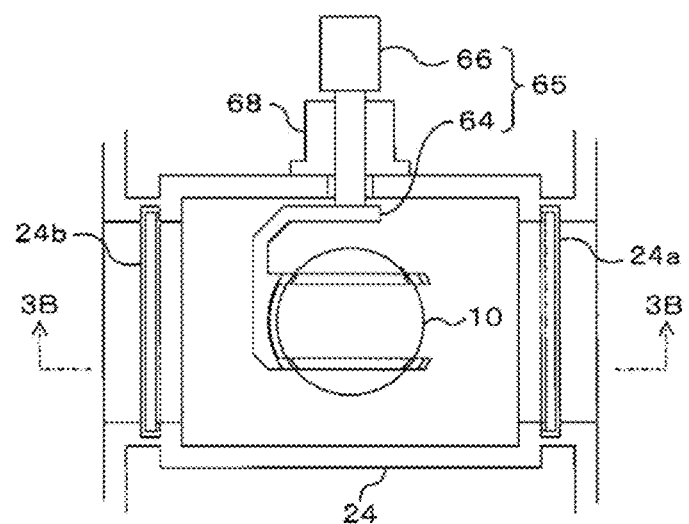
FIG. 5A is a plan view showing the inside of a delivery chamber 24 shown in FIGS. 2, and 5B is a cross-sectional view along a 3B-3B line shown in 5A.
Figure 5B:
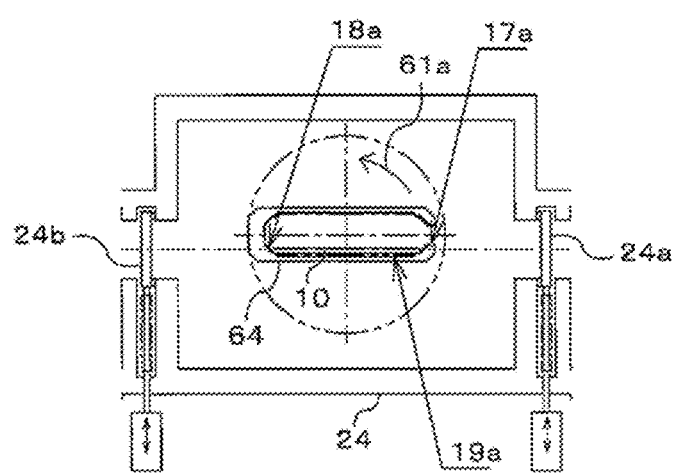
Figure 6A:
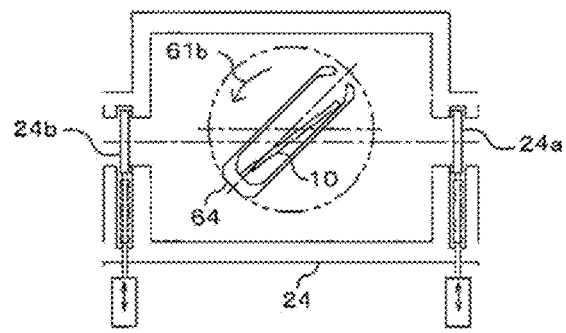
FIGS. 6A to 6C are cross-sectional views showing, in order, operations subsequent to FIGS. 5B, and 6C is a cross-sectional view along a 4C-4C line shown in FIG. 7.
Figure 6B:
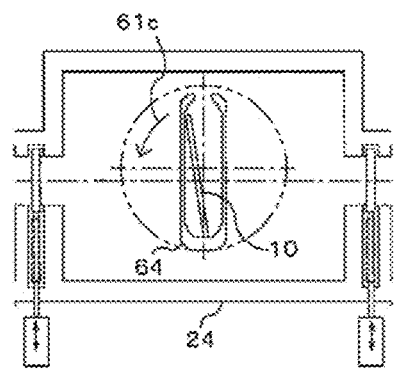

FIGS. 5A and 5B show states where the substrate 10 in the fourth sputtering apparatus 22 shown in FIG. 2 is conveyed to the conveyance chamber 17 by using the conveyance robot 18, and, after that, a gate valve 24a of the delivery chamber 24 is opened, the substrate 10 is placed on a delivery stage 64 in the delivery chamber 24 by using the conveyance robot 18, and the gate valve 24a is shut. Note that a stage reversing mechanism 65 has the delivery stage 64 and a motor 66. In addition, a substrate contact part 17a of the delivery stage 64 is made of a material not damaged, such as a Teflon (registered trade mark) coating, or has been subjected to a surface treatment. Furthermore, a substrate contact part 18a of the delivery stage 64 has a tapered shape. Moreover, a step part 19a of the delivery stage 64 is a step (concave part) so that the delivery stage 64 does not make contact with the film forming part, which is to be a product on the substrate 10. In addition, in the stage reversing mechanism 65, magnetism is sealed by a magnetism seal unit 68.

Next, the front face and the rear face of the substrate 10 are reversed by rotation of the delivery stage 64 along arrows 61a, 61b and 61c by using the motor 66, and thus the front face (film forming face) of the substrate 10 is directed upward (direction opposite to the gravity direction 61d) (refer to FIG. 5B, FIGS. 6A to 6C). FIG. 7 is a plan view showing the inside of the delivery chamber corresponding to a state shown in FIG. 6C, and shows a state where the front face (film forming surface) of the substrate 10 is directed upward (direction opposite to the gravity direction). Note that, in the present embodiment, the motor 66 rotates the delivery stage 64, but a rotary actuator (air drive) may rotate the delivery stage 64.

The gate valve 24b is connected to an air process side, and the gate valve 24a is connected to a vacuum process side.

Figure 6C:
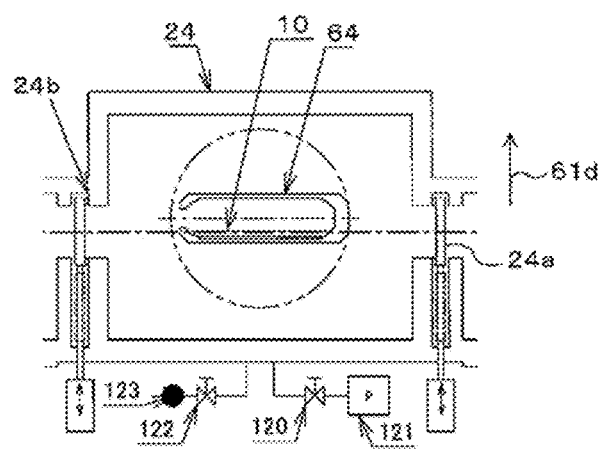
Figure 7:
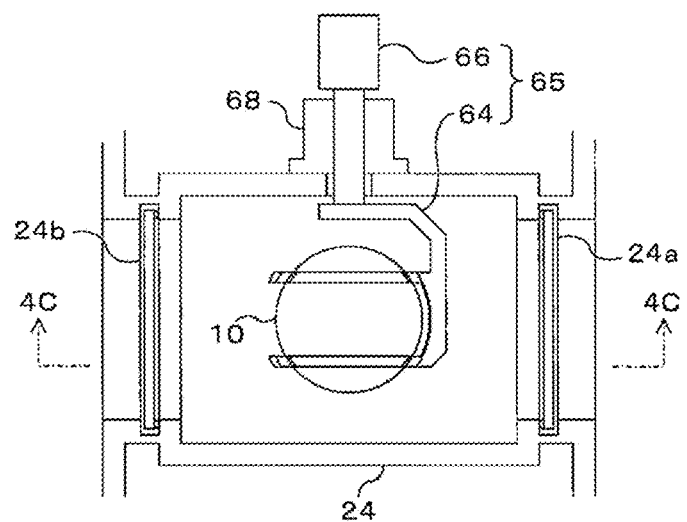
FIG. 7 is a plan view showing the inside of a delivery chamber corresponding to a state shown in FIG. 6C.

The delivery chamber 24 is connected to a vacuum pump 121 via a vacuum valve 120, and the delivery chamber 24 is connected to a vent gas source 123 via a vent pump (leak) 122 (refer to FIG. 6C). Furthermore, each of the loading/unloading room 23, the fourth sputtering apparatus 22, the third sputtering apparatus 22a, the electron beam vapor deposition apparatus 21, the first sputtering apparatus 20, the second sputtering apparatus 19 and the conveyance chamber 17 is connected to an evacuating mechanism (not shown) (refer to FIG. 2).

Subsequently, the substrate 10 in the delivery chamber 24 is conveyed to a stocker 26 by using a conveyance robot 25. Then, the substrate 10 in the stocker 26 is conveyed to an aligner 27 by using the conveyance robot 25, and a treatment of detecting the center position of the surface of the substrate 10 is performed by using the aligner 27. This treatment is performed for detecting the center position of the substrate surface and making the center position of the substrate surface and the rotation center of the substrate coincide with each other, in performing a spin-coating treatment.

After that, the substrate 10 in the aligner 27 is conveyed to a spin-coating room 28 by using the conveyance robot 25. Next, in the spin-coating room 28, a process of coating a film on the $Pb(Zr_{1-B}Ti_B)O_3$ seed crystal film 14 of the substrate 10 by spin coating is performed.

The process will be explained in detail below.

The substrate 10 is rotated while a cleaning liquid is being supplied on the substrate 10 with a cleaning nozzle. Consequently, the surface of the substrate 10 is cleaned. Next, the cleaning liquid on the substrate 10 is removed by stopping the supply of the cleaning liquid and rotating the substrate 10.

Next, the substrate 10 is rotated while a chemical material is being dropped onto the substrate 10 by using a dropping nozzle. Herewith, a cleaning liquid is dropped on the edge portion of the surface of the substrate 10 by using an edge rinse nozzle. Because of this, a noncrystalline precursor film is coated on the substrate 10. The reason why the cleaning liquid is dropped onto the edge portion of the substrate surface is that, since the thickness of the edge portion of the substrate 10 is formed larger than the thickness of the center of the substrate 10 when a film is coated on the substrate 10 by spin coating, the coating is performed while the film is being removed at the edge portion of the substrate 10 by using the cleaning liquid. Accordingly, it is preferable to gradually move the position of dropping the cleaning liquid from the edge portion of the substrate 10 toward the center side thereof, by gradually moving the edge rinse nozzle from the edge portion of the substrate 10 toward the center side thereof.

Next, the substrate 10 in the spin-coating room 28 is conveyed to an annealing apparatus 29 by using the conveyance robot 25, and a process of subjecting the noncrystalline precursor film on the substrate 10 to drying treatment, by using an annealing apparatus 29, is performed.

The process will be explained in detail below.

The substrate is heated to, for example, 200 to 250° C. by using a hot plate while the air on the surface of the film coated on the substrate 10 is being exhausted by using an exhaust mechanism. Thereby, moisture and the like in the noncrystalline precursor film are removed.

After that, the substrate 10 in the annealing apparatus 29 is conveyed into an annealing apparatus 30 by using the conveyance robot 25, and in the annealing apparatus 30, a process of subjecting the noncrystalline precursor film on the substrate 10 to temporary calcination is performed.

In detail, after evacuating the inside of a temporary calcination treatment room of the annealing apparatus 30 by an exhaust system, the inside of the temporary calcination treatment room is set to be a vacuum atmosphere, or set to be an ordinary pressure under a nitrogen gas atmosphere or an inert gas atmosphere by using a gas introduction mechanism, and temporary calcinations is performed by heating the noncrystalline precursor film on the substrate 10 to an intended temperature (for example, 300° C. to 600° C.) by using a lamp heater.

Subsequently, the substrate 10 in the temporary calcination treatment room of the annealing apparatus 30 is conveyed to a cooling apparatus 31 by using the conveyance robot 25, and the substrate 10 is cooled to a prescribed temperature in the cooling apparatus 31.

Then, the substrate 10 in the cooling apparatus 31 is conveyed to the aligner 27 by using the conveyance robot 25, and a treatment for detecting the center position of the surface of the substrate 10 is performed by using the aligner 27.

After that, the substrate 10 in the aligner 27 is conveyed to the spin-coating room 28 by using the conveyance robot 25.

Next, by repeating a plurality of times (for example, 30 times) processes of the spin-coating treatment, the drying treatment and the temporary calcination treatment in the same way as described above, a plurality of noncrystalline precursor films is stacked and formed on the $Pb(Zr_{1-B}Ti_B)O_3$ seed crystal film 14 of the substrate 10.

In chemical materials (solutions) when performing the spin-coating treatment, a Zr/Ti ratio in a chemical material to be coated on the side of the $Pb(Zr_{1-B}Ti_B)O_3$ seed crystal film 14 from the center of the whole noncrystalline precursor film in the thickness direction is preferably larger than a Zr/Ti ratio in a chemical material to be coated on the side opposite to the $Pb(Zr_{1-B}Ti_B)O_3$ seed crystal film 14 from the center of the whole noncrystalline precursor film in the thickness direction. More preferably, a Zr/Ti ratio in each of the chemical materials for spin-coating treatments that are performed a plurality of times become smaller in order of a region from the $Pb(Zr_{1-B}Ti_B)O_3$ seed crystal film 14 to 1/3 in the thickness direction of the whole noncrystalline precursor film, a region from the $Pb(Zr_{1-B}Ti_B)O_3$ seed crystal film to 1/3 to 2/3 in the thickness direction thereof, and a region from the $Pb(Zr_{1-B}Ti_B)O_3$ seed crystal film to 2/3 to 3/3 in the thickness direction thereof.

Lattice constants of noncrystalline precursor films in contact with each other can be brought close to each other by setting the ratio as described above, and thus the generation of breaks or cracks in the $Pb(Zr_{1-x}Ti_x)O_3$ crystal film 15 in crystallizing the noncrystalline precursor film in a later process can be suppressed.

Furthermore, the greater number of repetition times of the process of the spin-coating treatment, drying treatment and temporary calcination treatment can form a thicker film (for example, thickness of 1 μm or more) on the $Pb(Zr_{1-B}Ti_B)O_3$ seed crystal film 14. In this case, the use of the manufacturing apparatus of ferroelectric ceramics shown in FIG. 2 makes it possible to enhance the productivity. In detail, a sputtering film formation treatment, an electron beam vapor deposition treatment, a spin-coating treatment, a drying treatment and a temporary calcination treatment can be automatically performed by operating the manufacturing apparatus of ferroelectric ceramics as described above through the use of a control part (not shown). Therefore, when respective treatments are separately performed and an operator conveys the substrate 10 by hand, it is considered that the hand may go numb and the operator may make a mistake in the treatment order or drop the substrate 10, but, in the above process, there is an advantage that such situations do not occur. Accordingly, in mass production, the productivity can be enhanced and the yield can be enhanced.

After that, the substrate 10 in the temporary calcination treatment room of the annealing apparatus 30 is conveyed to a pressurizing-type lamp annealing apparatus 32 by using the conveyance robot 25. Note that the conveyance time of conveying the substrate 10 from the inside of the temporary calcination treatment room into the pressurizing-type lamp annealing apparatus 32 is preferably 10 sec or less.

The reason why the conveyance time is set to be short as described above is as follows. When the conveyance time becomes long, properties of the ferroelectric substance crystal film are largely influenced. In detail, after the temporary calcination, since the noncrystalline precursor film has a very high oxygen activity and is in an oxygen depletion condition, the film is bonded with oxygen in the air and properties of the film deteriorate. Accordingly, the conveyance time is preferably set to be short.

Then, a process of subjecting the noncrystalline precursor film of a plurality of layers on the substrate 10 to a lamp annealing treatment is performed by using the pressurizing-type lamp annealing apparatus 32.

In detail, the $Pb(Zr_{1-B}Ti_B)O_3$ seed crystal film 14 and the noncrystalline precursor film are heated in an oxygen atmosphere. Thereby, the $Pb(Zr_{1-x}Ti_x)O_3$ crystal film 15 can be formed by oxidizing and crystallizing the noncrystalline precursor film. Note that the $Pb(Zr_{1-B}Ti_B)O_3$ seed crystal film 14 and the noncrystalline precursor film may be heated in a pressurized oxygen atmosphere, and, preferably, may be heated in a pressurized oxygen atmosphere of 4 atm or more (more preferably 5 atm or more). Thereby, a ferroelectric substance crystal film having a stronger single orientation property can be obtained.

In the $Pb(Zr_{1-x}Ti_x)O_3$ crystal film 15, it is preferable that a Zr/Ti ratio on the $Pb(Zr_{1-B}Ti_B)O_3$ seed crystal film 14 side from the center in the thickness direction thereof is larger than a Zr/Ti ratio on the side opposite to the $Pb(Zr_{1-B}Ti_B)O_3$ seed crystal film 14 from the center in the thickness direction thereof. Furthermore, a Zr/Ti ratio in the $Pb(Zr_{1-x}Ti_x)O_3$ crystal film 15 become smaller in order of a region from the $Pb(Zr_{1-B}Ti_B)O_3$ seed crystal film 14 to 1/3 in the thickness direction thereof, a region from the $Pb(Zr_{1-B}Ti_B)O_3$ seed crystal film 14 to 1/3 to 2/3 in the thickness direction thereof, and a region from the $Pb(Zr_{1-B}Ti_B)O_3$ seed crystal film 14 to 2/3 to 3/3 in the thickness direction thereof.

Note that, in the present specification, the "$Pb(Zr_{1-x}Ti_x)O_3$ crystal film" also includes a film containing impurities in $Pb(Zr_{1-x}Ti_x)O_3$, and various substances may be contained as long as the impurities do not extinguish the function of the $Pb(Zr_{1-x}Ti_x)O_3$ crystal film 15 as a piezoelectric substance even when the impurities are contained.

After that, the substrate 10 in the annealing room of the pressurizing-type lamp annealing apparatus 32 is conveyed to the loading/unloading room 33 by using the conveyance robot 25, and the substrate 10 is taken out of the loading/unloading room 33 to the outside of the apparatus.

Note that, in the present embodiment, the noncrystalline precursor film is formed via the $SrRuO_3$ film, Pt film and the like on the silicon wafer 11, but the noncrystalline precursor film may be formed via another conductive film or insulating film on the silicon wafer 11.

Furthermore, since the noncrystalline precursor film and the $Pb(Zr_{1-B}Ti_B)O_3$ seed crystal film 14 are in complete surfaces contact, the crystal of the $Pb(Zr_{1-B}Ti_B)O_3$ seed crystal film 14 having a strong single orientation property is favorably transferred to the noncrystalline precursor film, and thus a crystal having a strong single orientation property is formed in the noncrystalline precursor film.

The $Pb(Zr_{1-x}Ti_x)O_3$ crystal film 15 has the same orientation as the orientation of the $Pb(Zr_{1-B}Ti_B)O_3$ seed crystal film 14. For example, when the $Pb(Zr_{1-B}Ti_B)O_3$ seed crystal film 14 is oriented to (001), the $Pb(Zr_{1-x}Ti_x)O_3$ crystal film 15 is also oriented to (001), and, when the $Pb(Zr_{1-B}Ti_B)O_3$ seed crystal film 14 is oriented to (111), the $Pb(Zr_{1-x}Ti_x)O_3$ crystal film 15 is also oriented to (111).

Moreover, B in the $Pb(Zr_{1-B}Ti_B)O_3$ seed crystal film 14 satisfies a formula 21 below, and thus it is possible that the $Pb(Zr_{1-B}Ti_B)O_3$ seed crystal film 14 is made to be easily oriented to (001).

$$0.48 < B \leq 0.6 \qquad \text{formula 21}$$

Furthermore, B in the $Pb(Zr_{1-B}Ti_B)O_3$ seed crystal film 14 satisfies a formula 22 below, and thus it is possible that the $Pb(Zr_{1-B}Ti_B)O_3$ seed crystal film 14 is made to be easily oriented to (111).

$$0.4 \leq B < 0.48 \qquad \text{formula 22}$$

The $Pb(Zr_{1-B}Ti_B)O_3$ seed crystal film 14 plays a role as an initial nucleus in crystallizing the noncrystalline precursor film.

A ratio of Zr to Ti in the whole of the $PbZrO_3$ film 104, the $Pb(Zr_{1-B}Ti_B)O_3$ seed crystal film 14 and the $Pb(Zr_{1-x}Ti_x)O_3$ crystal film 15 satisfies a formula 4 below. At this time, it is sufficient that B and x satisfy formulae 2 and 3 below and may not necessarily satisfy formulae 2' and 3' below. This is because the ratio of Zr to Ti in the whole of the $PbZrO_3$ film 104, $Pb(Zr_{1-B}Ti_B)O_3$ seed crystal film 14 and the $Pb(Zr_{1-x}Ti_x)O_3$ crystal film 15 can satisfy the formula 4 below, by adjusting the thickness of the $PbZrO_3$ film 104.

$$60/40 \leq Zr/Ti \leq 80/20 \qquad \text{formula 4}$$

$$0.1 < B < 1 \qquad \text{formula 2}$$

$$0.1 < x < 1 \qquad \text{formula 3}$$

$$0.4 \leq B \leq 0.6 \qquad \text{formula 2'}$$

$$0.4 \leq x \leq 0.6 \qquad \text{formula 3'}$$

A ratio of Zr to Ti in the whole of the $Pb(Zr_{1-B}Ti_B)O_3$ seed crystal film 14 and the $Pb(Zr_{1-x}Ti_x)O_3$ crystal film 15 preferably satisfies formula 6 below.

$$52/48 \leq Zr/Ti \qquad \text{formula 6}$$

The reason why the ratio is to be set in the range of the formula 6 is that PZT of a Ti-rich tetragonal composition becomes harder than PZT of a Zr-rich rhombic composition, and that, in bulk PZT, piezoelectric properties are easily extracted even from a tetragonal composition, but in thin film PZT, piezoelectric properties become hard to be extracted from a tetragonal composition. Namely, in the $Pb(Zr_{1-B}Ti_B)O_3$ seed crystal film 14 and the $Pb(Zr_{1-x}Ti_x)O_3$ crystal film 15 of a thin film, piezoelectric properties can be easily extracted in the case of a rhombic composition.

According to the present embodiment, piezoelectric properties of the $Pb(Zr_{1-B}Ti_B)O_3$ seed crystal film 14 and the $Pb(Zr_{1-x}Ti_x)O_3$ crystal film 15 can be enhanced by using the PZO film 104 as an initial nucleus layer (that is, buffer layer) of the $Pb(Zr_{1-B}Ti_B)O_3$ seed crystal film 14. When giving a detailed explanation, $PbZrO_3$ (PZO) is caused when the Ti ratio is 0 (zero) in the phase diagram of $Pb(Zr_{1-B}Ti_B)O_3$ (PZT), and is an antiferroelectric substance. However, PbZrO$_3$ (PZO) has the longest c axis length among Pb(Zr$_{1-B}$Ti$_B$)O$_3$, and PZO works in a direction extending the c axis length of all PZT and can make the largest piezoelectric performance that can be exerted by the structure be easily obtained. Namely, the whole of PZT are influenced from the crystal axis of the PZO initial nucleus by setting PZO as the initial nucleus, and the c crystal axis gets easily longer in the whole PZT film, that is, easily polarized, and thus it becomes possible to easily extract piezoelectric properties.

Note that, in the present embodiment, the PZO film 104 having a Ti ratio of zero in the phase diagram of Pb(Zr, Ti)O$_3$ is formed on the SrRuO$_3$ film 13b of the substrate 10, and the Pb(Zr$_{1-B}$Ti$_B$)O$_3$ seed crystal film 14 (0.1<B<1 . . . formula 2) is formed on the PZO film 104, but the Pb(Zr$_{1-B}$Ti$_B$)O$_3$ seed crystal film 14 may be formed on a Pb(Zr$_{1-A}$Ti$_A$)O$_3$ film having a very small Ti ratio. However, A and B satisfy formulae 1 and 2 described below.

$$0 \leq A \leq 0.1 \quad \text{formula 1}$$

$$0.1 < B < 1 \quad \text{formula 2}$$

The Pb(Zr$_{1-A}$Ti$_A$)O$_3$ film to be used as the initial nucleus becomes PZT of an antiferroelectric rhombic crystal phase (namely, PZT in the rhombic crystal region (ortho region) in the phase diagram of Pb(Zr, Ti)O$_3$) by satisfying the formula 1, that is, by setting the Ti ratio to be 10% or less, and Pb(Zr$_{1-A}$Ti$_A$)O$_3$ works in a direction extending the c axis length of all Pb(Zr$_{1-B}$Ti$_B$)O$_3$ (PZT), and the same effect as that of the above-described embodiment can be obtained.

Furthermore, according to the present embodiment, since the Pb(Zr$_{1-B}$Ti$_B$)O$_3$ seed crystal film 14 is formed by the sputtering method of deposition-up shown in FIG. 3A, the substrate 10 side of the Pb(Zr$_{1-B}$Ti$_B$)O$_3$ seed crystal film 14 is negatively polarized and the side of the Pb(Zr$_{1-B}$Ti$_B$)O$_3$ seed crystal film 14 opposite to the substrate 10 is positively polarized. Since the Pb(Zr$_{1-x}$Ti$_x$)O$_3$ crystal film 15 on the Pb(Zr$_{1-B}$Ti$_B$)O$_3$ seed crystal film 14 is formed by a sol-gel method, the substrate 10 side of the Pb(Zr$_{1-x}$Ti$_x$)O$_3$ crystal film 15 is negatively polarized, and the side of the Pb(Zr$_{1-x}$Ti$_x$)O$_3$ crystal film 15 opposite to the substrate 10 is positively polarized. Accordingly, the polarization direction of the Pb(Zr$_{1-B}$Ti$_B$)O$_3$ seed crystal film 14 becomes identical to the polarization direction of the Pb(Zr$_{1-x}$Ti$_x$)O$_3$ crystal film 15. Thereby, it becomes unnecessary to give polling processing to thereby reduce the manufacturing process.

Moreover, according to the present embodiment, even a Pb(Zr$_{1-x}$Ti$_x$)O$_3$ crystal film that is made by using a spin-coating method, a single orientation property or preferential orientation property can be made high. In detail, the Pb(Zr$_{1-x}$Ti$_x$)O$_3$ crystal film 15 having the same orientation as the orientation of the Pb(Zr$_{1-B}$Ti$_B$)O$_3$ seed crystal film 14 can be formed by performing heating and crystallization in an oxygen atmosphere while utilizing the Pb(Zr$_{1-B}$Ti$_B$)O$_3$ seed crystal film 14 that is singly oriented or preferentially oriented and has very good crystallinity as the initial nucleus of a noncrystalline precursor film.

In other words, the preferential orientation of the Pb(Zr$_{1-B}$Ti$_B$)O$_3$ seed crystal film 14 having very good crystallinity by epitaxial growth can be faithfully transferred to the Pb(Zr$_{1-x}$Ti$_x$)O$_3$ crystal film 15 using a spin-coating method. As the result, the Pb(Zr$_{1-x}$Ti$_x$)O$_3$ crystal film 15 that is singly oriented or preferentially oriented and has good crystallinity can be obtained.

Namely, the Pb(Zr$_{1-x}$Ti$_x$)O$_3$ crystal film 15 using a spin-coating method on the Pb(Zr$_{1-B}$Ti$_B$)O$_3$ seed crystal film 14 that is epitaxially grown by a sputtering method has the same crystal structure as the Pb(Zr$_{1-B}$Ti$_B$)O$_3$ seed crystal film 14.

Furthermore, the crystal structure of the Pb(Zr$_{1-x}$Ti$_x$)O$_3$ crystal film 15 can be controlled by forming the Pb(Zr$_{1-x}$Ti$_x$)O$_3$ crystal film 15 on the Pb(Zr$_{1-B}$Ti$_B$)O$_3$ seed crystal film 14 in which a crystal structure has been determined.

Moreover, the formation rate of the Pb(Zr$_{1-x}$Ti$_x$)O$_3$ crystal film 15 using a spin-coating method is much larger than the formation rate of a ferroelectric substance crystal film formed by the conventional epitaxial growth through a sputtering method. Therefore, the manufacturing method of ferroelectric ceramics according to an aspect of the present invention, in which the Pb(Zr$_{1-x}$Ti$_x$)O$_3$ crystal film 15 is formed on the Pb(Zr$_{1-B}$Ti$_B$)O$_3$ seed crystal film 14 by using a spin-coating method, is a method having a film formation rate that is suitable for mass production.

Furthermore, an aspect of the present invention can be applied to electronic components having the above-described ferroelectric ceramics.

Second Embodiment

Figure 8:
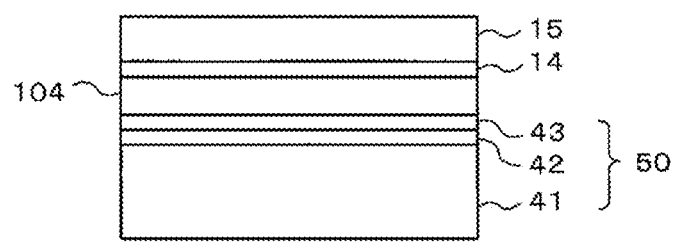
FIG. 8 is a cross-sectional view for explaining a manufacturing method of ferroelectric ceramics according to an aspect of the present invention.

FIG. 8 is a cross-sectional view for explaining a manufacturing method of ferroelectric ceramics according to an aspect of the present invention, in which the same sign is attached to the same part in FIG. 1.

First, a substrate 41 is prepared. Various substrates can be used as the substrate, and there can be used, for example, a substrate of a single crystal such as a Si single crystal and a sapphire single crystal, a single crystal substrate with a metal oxide film formed on the surface thereof, a substrate with a polysilicon film or a silicide film formed on the surface thereof, and the like. Note that, in the present embodiment, the Si substrate 41 oriented to (100) is used.

Next, a ZrO$_2$ film 42 is formed on the Si substrate 41 by a vapor deposition method at temperatures of 550° C. or less (preferably at a temperature of 500° C.). The ZrO$_2$ film 42 is oriented to (100). Note that, when a ZrO$_2$ film is formed by a vapor deposition method at temperatures of 750° C. or more, the ZrO$_2$ film is not oriented to (100).

In the present specification, "being oriented to (100)," "being oriented to (200)" and "being oriented to (400)" are substantially equal to each other, and "being oriented to (001)," "being oriented to (002)" and "being oriented to (004)" are substantially equal to each other.

After that a lower electrode 43 is formed on the ZrO$_2$ film 42. The lower electrode 43 is formed of an electrode film made of a metal or an oxide. For example, a Pt film or an Ir film is used as the electrode film made of a metal. An example of the electrode film made of an oxide is a Sr(Ti$_{1-x}$Ru$_x$)O$_3$ film, in which x satisfies formula 44 below.

$$0.01 \leq x \leq 0.4 \quad \text{formula 44}$$

In the present embodiment, a Pt film 43 by epitaxial growth is formed on the ZrO$_2$ film as a lower electrode by sputtering at temperatures of 550° C. or less (preferably at a temperature of 400° C.). The Pt film 43 is oriented to (200).

In this way, a substrate 50 is produced. The process of forming the PZO film 104 on the substrate 50 and subsequent processes are the same as those in the first embodiment, and explanation thereof is omitted.

Also in the present embodiment, the same effect as that in the first embodiment can be obtained.

Third Embodiment

Hereinafter, the same parts as those in the second embodiment and different parts from those in the second embodiment of the present embodiment will be explained.

The Si substrate, $ZrO_2$ film and lower electrode are formed by the same methods as those in the second embodiment, respectively, and thus the explanation thereof is omitted.

Next, an oxide film is formed on the lower electrode. The oxide film is favorably an oxide of a perovskite structure, and is, for example, a $Sr(Ti, Ru)O_3$ film. The $Sr(Ti, Ru)O_3$ film is a $Sr(Ti_{1-x}Ru_x)O_3$ film and is formed by sputtering, and x satisfies a formula 42 below. A sintered body of $Sr(Ti_{1-x}Ru_x)O_3$ is used as a sputtering target at this time. However, x satisfies a formula 42 below.

$$0.01 \leq x \leq 0.4 \text{ (preferably } 0.05 \leq x \leq 0.2\text{)} \qquad \text{formula 42}$$

Note that the reason why x in the $Sr(Ti_{1-x}Ru_x)O_3$ film is 0.4 or less is because, when x exceeds 0.4, the $Sr(Ti_{1-x}Ru_x)O_3$ film becomes powdery and can not sufficiently be solidified.

After that, the $Sr(Ti_{1-x}Ru_x)O_3$ film is crystallized by RTA (Rapid Thermal Anneal) in a pressurized oxygen atmosphere. The $Sr(Ti_{1-x}Ru_x)O_3$ film is made from a complex oxide of strontium, titanium and ruthenium, and is a compound having a perovskite structure.

Then, a PZO film is formed on the oxide film in the same way as that in the second embodiment. Subsequent processes are the same as those in the second embodiment, and thus the explanation thereof is omitted.

Also in the present embodiment, the same effect as that in the second embodiment can be obtained.

Note that the above-described first to third embodiments may appropriately be combined and practiced.

Example 1

FIG. 9 is a cross-sectional view showing a structure of PZT films of a Sample 1 in Example 1 and a Sample 2 in Comparative Example. The PZT film is formed on a substrate (not shown).

Production Method of Sample 1 in Example 1

An SPT-PZT (58/42) seed crystal film having a thickness of 100 nm as an initial nucleus is formed on a substrate by a sputtering method under following conditions.

[Sputtering Conditions]
Apparatus: RF magnetron sputtering apparatus
Sputtering system: deposition-up shown in FIG. 3A
Target composition: $Pb(Zr_{58}Ti_{42})O_3$
Power: 1500 W
Gas: $Ar/O_2$
Pressure: 0.14 Pa
Temperature: 600° C.
Film formation rate: 0.63 nm/sec
Film formation time: 1.3 min Next, a PZT precursor solution is prepared. The PZT precursor solution is a precursor solution containing, in an organic solvent, a metal compound wholly or partially including ingredient metals of a PZT crystal and a partial polycondensation product thereof, and is a solution that contains 25% by weight of PZT (Zr/Ti=70/30) in concentration and 20%-excessive Pb. Subsequently, a coating film of a second layer is overlapped and formed on the SPT-PZT (58/42) seed crystal film, by coating the PZT precursor solution onto the SPT-PZT (58/42) seed crystal film by a spin-coating method. In detail, a 500 μL of the PZT precursor solution is coated onto the SPT-PZT (58/42) seed crystal film, the rotation rate is increased from 0 to 500 rpm over a period of 3 sec, which is held at 500 rpm for 5 sec, and then rotated at 1500 rpm for 20 sec, and the rotation was stopped. Then, the coated PZT precursor solution was held for 30 sec on a hot plate while being heated at 250° C. to thereby be dried, and moisture is removed. After that, on a hot plate held at higher temperatures, the resultant substance is subjected to temporary calcination by being held for 60 sec while being heated at 450° C. In this way, the PZT (70/30) film of a second layer is formed on the SPT-PZT (58/42) seed crystal film. The reason why a Zr/Ti ratio of 70/30 is used for the PZT film of a second layer is as follows. The first reason is because the effect of elongating the c axis length of the crystal lattice of the PZT film can be expected by setting the Zr ratio to be high, and the second reason is because, since Zr/Ti of the outermost surface part of the SPT-PZT (58/42) seed crystal film (namely, a part in contact with the PZT film of the second layer) becomes considerably Zr rich than 58/42 as shown in Table 1 to be described later, the generation of breaks or cracks in the PZT film is suppressed by bringing the lattice constant closer to that of the outermost surface part of the SPT-PZT (58/42) seed crystal film.

Next, spin coating, drying and temporary calcination are performed in the same way as those described above. The PZT precursor solution at this time is a solution having a concentration of 25% by weight of PZT (Zr/Ti=65/35) and 20%-excessive Pb. In this way, a PZT (65/35) film of the third layer is formed on the PZT (70/30) film.

Subsequently, spin coating, drying and temporary calcination are performed in the same way as those described above. The PZT precursor solution at this time is a solution having a concentration of 25% by weight of PZT (Zr/Ti=60/40) and 20%-excessive Pb. In this way, a PZT (60/40) film of the fourth layer is formed on the PZT (65/35) film.

Then, spin coating, drying and temporary calcination are performed in the same way as those described above. However, the PZT precursor solution at this time is a solution having a concentration of 25% by weight of PZT (Zr/Ti=55/45) and 20%-excessive Pb. In this way, a PZT (55/45) film of the fifth layer is formed on the PZT (60/40) film.

After that, spin coating, drying and temporary calcination are performed in the same way as those described above. However, the PZT precursor solution at this time is a solution having a concentration of 25% by weight of PZT (Zr/Ti=50/50) and 20%-excessive Pb. In this way, a PZT (50/50) film of the sixth layer is formed on the PZT (55/45) film. Note that a thickness intended for each of the second to sixth layers is 250 nm, but the film thickness after the temporary calcination became 240 nm. The intended total thickness of the first to sixth layers is 1.35 μm.

Lattice constants of noncrystalline precursor films in contact with each other can be brought closer by making Zr ratios in PZT films of the second to sixth layers gradually smaller as described above. As the result, the generation of breaks or cracks in the PZT film in crystallization in a later process can be suppressed.

Next, PZT amorphous films of the second to sixth layers having been subjected to temporary calcination are held in an oxygen atmosphere of 10 atm at a temperature of 700° C. for 3 min and are subjected to an annealing treatment and crystallization of PZT, through the use of a pressurizing-type lamp annealing apparatus (RTA: rapidly thermal anneal). The crystallized PZT film is a ferroelectric substance-coated and -sintered crystal film, and has a perovskite structure.

Production Method of Sample 2 in Comparative Example

A SPT-PZT (58/42) seed crystal film having a thickness of 100 nm as an initial nucleus is formed on a substrate by a sputtering method. Sputtering conditions at this time are different from sputtering conditions for the Sample 1 in a point where the sputtering system is of deposition-down shown in FIG. 3B, and other conditions are the same as those for the Sample 1.

Next, on the SPT-PZT (58/42) seed crystal film, the PZT (70/30) film, the PZT (65/35) film, the PZT (60/40) film, the PZT (55/45) film and the PZT (50/50) film of the second to sixth layers are formed in the same way as that for the Sample 1. After that, PZT crystallization is performed in the same way as that for the Sample 1.

A ferroelectric substance has domains in which spontaneous polarization directions become the same, and the structure of the domain changes by the application of an external electric field. The ferroelectric substance has high permittivity, pyroelectric properties and piezoelectric properties, and residual polarization by the existence of the reversible spontaneous polarization.

In order that a ferroelectric substance obtains piezoelectric properties, usually a polarization treatment in which the polarization is to be dominantly oriented in the electric field application direction is necessary, but in the case of a PZT film made by a sputtering method, a spontaneous polarization state is often reached at the same time as film completion.

The above-described state is desirable in the case of a piezoelectric thin film device in which several thousands to tens of thousands of devices are taken out from one silicon wafer. It is difficult to perform so-called polling processing as is the case for a piezoelectric bulk ceramics from the viewpoint of the number and size of devices, and the completion of the polarization treatment at the same time as film formation is very effective.

Relationships of polarization (P) and electric field-induced strain ($\Delta L/L$) relative to an electric field (E) according to a sample in the Example are shown in FIG. 10 as conceptual views of a ferroelectric substance PZT thin film. FIG. 10 shows a state of piezoelectric strain of the piezoelectric substance thin film, in which FIG. 10A is a drawing showing change in polarization when a bipolar electric field is applied to the piezoelectric substance film of the Sample 1, and FIG. 10B is a drawing showing change in strain when a bipolar electric field is applied to the piezoelectric substance film of the Sample 1.

As shown in FIG. 10, in the produced PZT thin film, spontaneous polarization A and electric field-induced strain A' generated by A at that time are detected. In the application of a voltage not higher than a coercive voltage (coercive electric field×film thickness), when the polarization direction is the same as the applied electric field direction, the electric field-induced strain and the polarization increase together with the applied electric field, but when the polarization direction and the applied electric field direction are opposite to each other, both strain and polarization decrease together with the electric field.

A curve taken out of the piezoelectric curve within a square obtained by using dotted lines shown in FIG. 10B is referred to as a piezoelectric butterfly strain curve (bipolar electric field drive), and, among these, piezoelectric properties of linear lines that approximately overlap with each other in both going and returning ways (elongation and contraction change in the same linear line shape) are desired as good piezoelectric properties.

FIG. 11 is an FIB film cross-sectional image of the Sample 1 in Example 1.

Figure 12B:
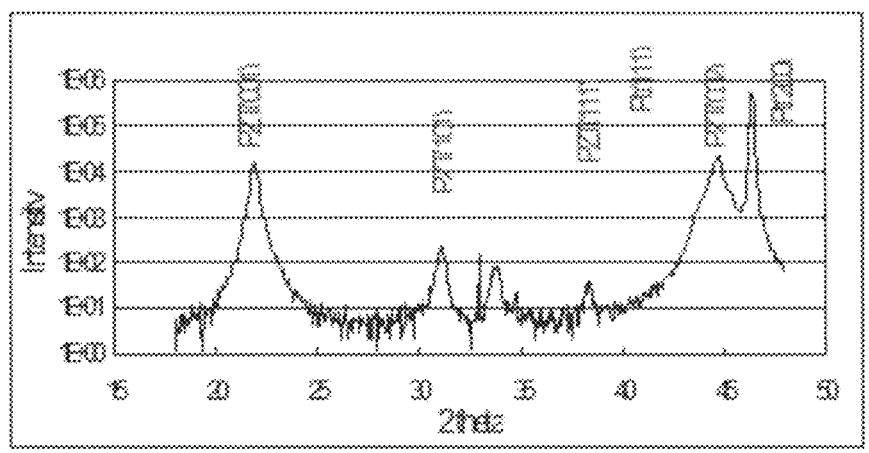

FIG. 12A is a chart showing an XRD pattern of the Sample 1 in Example 1, and FIG. 12B is a chart showing an XRD pattern of the Sample 2 in Comparative Example.

As shown in FIG. 12, peak intensities and peak positions are slightly different from each other in samples 1 and 2, but, in both samples, obtained peaks were only peaks reflecting PZT (001). Each of the film thicknesses of samples 1 and 2 was approximately 1.35 µm as intended, and the thickness of each layer was also approximately 240 nm as intended.

FIG. 13 is a drawing showing a D-E hysteresis curve and piezoelectric butterfly properties of a PZT thin film of the Sample 1 in Example 1. As shown in FIG. 13, it was confirmed that the PZT thin film of the Sample 1 had an ideal D-E hysteresis curve and piezoelectric butterfly properties. Vc=approximately ±7 V and Pr=approximately 40 µC/cm$^2$ held from the D-E hysteresis curve. In addition, the relative permittivity showed a numerical value as extremely small as $\varepsilon r$=approximately 400. Furthermore, d31=−150 pm/V held from the piezoelectric butterfly properties.

FIG. 14A shows drawings of a piezoelectric current property and a piezoelectric hysteresis property of the Sample 1 in Example 1, and 14B shows drawings of a piezoelectric current property and a piezoelectric hysteresis property of the Sample 2 in Comparative Example.

Figure 14B:
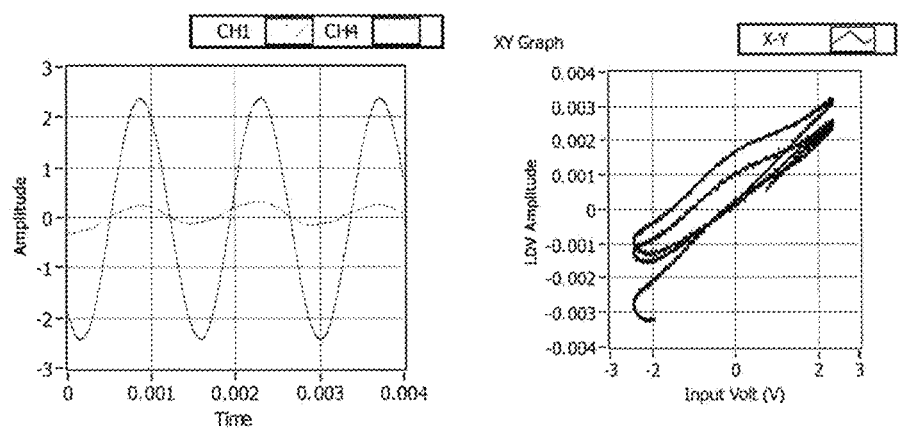

As shown in FIG. 14, when piezoelectric properties by a bipolar drive were compared for samples 1 and 2, piezoelectric properties completely different from each other were shown. In the case of Sample 1 in Example 1, a large piezoelectric current was obtained at a bipolar electric field as extremely small as ±2.5 V @700 Hz, and in the same way as the piezoelectric butterfly curve, d31=−150 µm/V held. Sample 1A showed a very high strain property from the piezoelectric hysteresis property measured at the same time, and had properties most suitable for a piezoelectric device. As described above, it was found that the Sample 1 had excellent piezoelectric properties, at the same time, polling was finished concurrently with film formation, and excellent piezoelectric properties were able to be taken out concurrently with the film formation.

On the other hand, in the case of the Sample 2 using an initial nucleus by deposition-down, almost no piezoelectric current was not able to be detected, and in the same way, excellent piezoelectric properties were not able to be taken out by bipolar application of ±2.5 V. At the time of completion of the film formation, no self-polling had occurred and the Sample 2 did not have excellent piezoelectric properties. As described above, it was found that the PZT initial nucleus according to the sputtering method of deposition-up was absolutely indispensable in order to take out good piezoelectric properties from a spin-coated PZT film.

Namely, the polarization direction of the SPT-PZT (58/42) seed crystal film of the first layer is the same as each of the polarization directions of PZT films of the second to sixth layers by a sol-gel method, and thus it becomes unnecessary to give polling processing, with the result that a manufacturing process can be reduced.

Example 2

Production Method of Sample 3 in Example 2

An SPT-PZT film having a thickness of 4 µm is formed on a substrate by a sputtering method. Sputtering conditions at this time are the same as sputtering conditions for Sample 1 in Example 1. Namely, in the Sample 3, a PZT film having a thickness of 4 µm was produced by a sputtering method of deposition-up.

Production Method of Sample 4 in Comparative Example

An SPT-PZT film having a thickness of 4 µm is formed on a substrate by a sputtering method. Sputtering conditions at this time are the same as sputtering conditions for Sample 2 in Comparative Example in Example 1. Namely, in the Sample 4, a PZT film having a thickness of 4 µm was produced by a sputtering method of deposition-down.

FIG. 15 shows a cross-sectional image of an FIB film of a Sample 3 in Example 2 and charts of the XRD pattern of the Sample 3. Note that, in charts of XRD pattern in FIG. 15, the vertical axis shows intensity and the horizontal axis shows 2θ.

When film compositions of samples 3 and 4 were examined by XRF, each of a samples 3 and 4 also had a composition as Zr-rich as Zr/Ti=60/40 in terms of average composition ratios of films, as shown in Table 1. Therefore, when element analysis in the depth direction was performed by using a glow discharge optical emission spectrometer (GD-OES) while the PZT film is being dug, results of both samples were largely different from each other.

Note that Table 1 shows results obtained by analyzing Zr/Ti ratios of film average for respective PZT films of samples 3 and 4 by XRF, and results obtained by analyzing Zr/Ti ratios in the depth direction by GD-OES for respective PZT films of samples 3 and 4.

Each of samples 3 and 4 had an inclined composition, but the tendency thereof was quite opposite to each other as shown in Table 1. In the case of the Sample 3 in the Example (deposition-up), it was known that an upper portion of the film had Zr-richer composition, and a lower portion closer to the substrate by digging the film had Ti richer. In contrast, in the case of the Sample 5 in Comparative Example (deposition-down), it was known that an upper portion of the film had Ti-richer composition, and a lower portion closer to the substrate by digging the film had Zr richer.

TABLE 1

| SAMPLE NAME | SAMPLE 3 | SAMPLE 4 |
| --- | --- | --- |
| FILM AVERAGE Zr/Ti RATIO | 60/40 | 60/40 |
| Zr/Ti RATIO AT −1 µm FROM ABOVE | 65/35 | 56/44 |
| Zr/Ti RATIO AT −2 µm FROM ABOVE | 63/37 | 58/42 |
| Zr/Ti RATIO AT −3 µm FROM ABOVE | 58/42 | 64/36 |
| Zr/Ti RATIO AT −4 µm FROM ABOVE | 55/45 | 65/35 |

Figure 16B:
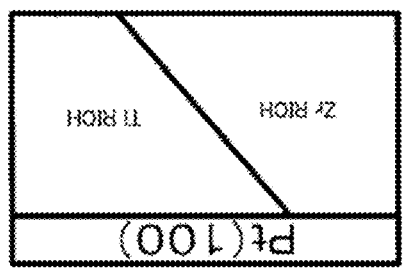
Figure 16C:
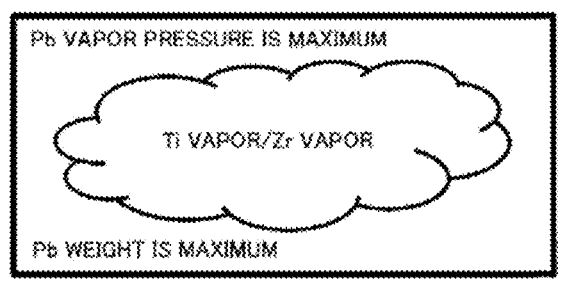

FIG. 16A is a drawing schematically showing a composition of a PZT film formed by a sputtering method of deposition-down on a Pt film oriented to (100), and FIG. 16B is a drawing schematically showing a composition of a PZT film formed by a sputtering method of deposition-up on a Pt film oriented to (100). FIG. 16C is a drawing schematically showing Ti vapor, Zr vapor and Pb vapor in a sputtering chamber.

Film average composition ratios of PZT films shown in FIGS. 16A and 16B are, respectively, Zr/Ti=55/45. Zr is heavier than Ti. The vapor pressure of Zr is lower than the vapor pressure of Ti. The melting point and boiling point of Zr are lower than the melting point and boiling point of Ti. From these, Ti vapor, Zr vapor and Pb vapor are considered to reach a state as shown in FIG. 16C.

Namely, as shown in FIG. 16A, when sputtering is performed in a state of deposition-down, Zr having a heavier weight is considered to tend to be earlier film-formed on a substrate, and thus the composition becomes Zr-richer at a position closer to the substrate, whereas, as shown in FIG. 16B, Ti having a lighter weight is considered to tend to be earlier film-formed, and thus it is considered that the composition becomes Ti-richer at a position closer to the substrate.

From the above, in the Sample 1 in Example 1, the polarization direction of the SPT-PZT (58/42) seed crystal film of the first layer becomes identical to the polarization direction of PZT films of from the second to sixth layers by a sol-gel method, whereas, in the Sample 2 in Comparative Example in Example 1, the polarization direction of the SPT-PZT (58/42) seed crystal film of the first layer does not become identical (becomes opposite) to each of the polarization directions of PZT films of the second to sixth layers by a sol-gel method.

EXPLANATION OF SYMBOLS 10 substrate
11 silicon wafer
12 film
13a Pt film
13b SrRuO$_3$ film
14 Pb(Zr$_{1-B}$Ti$_B$)O$_3$ seed crystal film
15 Pb(Zr$_{1-x}$Ti$_x$)O$_3$ crystal film
16 stocker
17 conveyance chamber
18 conveyance robot
19 second sputtering apparatus
20 first sputtering apparatus
21 electron beam vapor deposition apparatus
22a third sputtering apparatuses
22 fourth sputtering apparatus
23 loading/unloading room
24 delivery chamber
25 conveyance robot
26 stocker
27 aligner
28 spin-coating room
29 annealing apparatus
30 annealing apparatus
31 cooling apparatus
32 pressurizing-type lamp annealing apparatus
33 loading/unloading room
40 sputtering target
41 Si substrate
42 ZrO$_2$ film
43 lower electrode (Pt film)
50 substrate
104 PbZrO$_3$ film (PZO film)

The invention claimed is:
1. Ferroelectric ceramics comprising:
a foundation film;
a Pb(Zr$_{1-A}$Ti$_A$)O$_3$ film formed on the foundation film;
a Pb(Zr$_{1-B}$Ti$_B$)O$_3$ seed crystal film formed, by sputtering, on the Pb(Zr$_{1-A}$Ti$_A$)O$_3$ film; and
a Pb(Zr$_{1-x}$Ti$_x$)O$_3$ crystal film formed on the Pb(Zr$_{1-B}$Ti$_B$)O$_3$ seed crystal film, wherein:
the foundation film is a Pt film oriented to (100), or the foundation film is a double-layer film comprising a Pt film oriented to (100) and a $SrRuO_3$ film formed on the Pt film and oriented to (001);

the $Pb(Zr_{1-A}Ti_A)O_3$ film is in contact with the foundation film;

the $Pb(Zr_{1-x}Ti_x)O_3$ crystal film is crystallized by coating and heating a solution containing, in an organic solvent, a metal compound wholly or partially containing ingredient metals of the $Pb(Zr_{1-x}Ti_x)O_3$ crystal film and a partial polycondensation product thereof;

a Zr/Ti ratio in the $Pb(Zr_{1-x}Ti_x)O_3$ crystal film in the thickness direction thereof becomes gradually smaller or decreases in steps with increase in distance from the $Pb(Zr_{1-B}Ti_B)O_3$ seed crystal film;

a Zr/Ti ratio in the $Pb(Zr_{1-B}Ti_B)O_3$ seed crystal film in the thickness direction thereof becomes gradually larger with increase in distance from the $Pb(Zr_{1-A}Ti_A)O_3$ film toward the $Pb(Zr_{1-x}Ti_x)O_3$ crystal film;

the $Pb(Zr_{1-x}Ti_x)O_3$ crystal film comprises a $Pb(Zr_{0.70}Ti_{0.30})O_3$ film formed on the $Pb(Zr_{1-B}Ti_B)O_3$ seed crystal film, a $Pb(Zr_{0.65}Ti_{0.35})O_3$ film formed on the $Pb(Zr_{0.70}Ti_{0.30})O_3$ film, and a plurality of PZT films stacked and formed on the $Pb(Zr_{0.65}Ti_{0.35})O_3$ film;

a Zr/Ti ratio in each of the $Pb(Zr_{0.70}Ti_{0.30})O_3$ film, the $Pb(Zr_{0.65}Ti_{0.35})O_3$ film, and the plurality of PZT films in the thickness direction thereof becomes gradually smaller with increase in distance from the $Pb(Zr_{1-B}Ti_B)O_3$ seed crystal film;

a polarization direction of the $Pb(Zr_{1-B}Ti_B)O_3$ seed crystal film is identical to a polarization direction of the $Pb(Zr_{1-x}Ti_x)O_3$ crystal film;

the $Pb(Zr_{1-B}Ti_B)O_3$ seed crystal film and the $Pb(Zr_{1-x}Ti_x)O_3$ crystal film are oriented to (001); and the A, the B and the x satisfy formulae 1 to 3, respectively, $$0 \leq A \leq 0.1 \quad \text{formula 1}$$

$$0.1 < B < 1 \quad \text{formula 2}$$

$$0.1 < x < 1 \quad \text{formula 3.}$$

2. The ferroelectric ceramics according to claim 1, wherein:

the $Pb(Zr_{1-B}Ti_B)O_3$ seed crystal film is formed by sputtering while the $Pb(Zr_{1-A}Ti_A)O_3$ film is being disposed on an upper side of a sputtering target and the $Pb(Zr_{1-A}Ti_A)O_3$ film is being made to face the sputtering target.

3. The ferroelectric ceramics according to claim 1, wherein a ratio of Pb to (Zr+Ti) in each of the $Pb(Zr_{1-B}Ti_B)O_3$ seed crystal film and the $Pb(Zr_{1-x}Ti_x)O_3$ crystal film satisfies formula 5 below, $$Pb/(Zr+Ti) < 1.06 \quad \text{formula 5.}$$

4. The ferroelectric ceramics according to claim 1, wherein:

the B is 0.42;

the x is 0.4; and the thickness of the $Pb(Zr_{1-x}Ti_x)O_3$ crystal film, in which the Zr/Ti ratio becomes gradually smaller or decreases in steps with increase in distance from the $Pb(Zr_{1-B}Ti_B)O_3$ seed crystal film, is 12 times larger than the thickness of the $Pb(Zr_{1-B}Ti_B)O_3$ seed crystal film, in which the Zr/Ti ratio becomes gradually larger with increase in distance from the $Pb(Zr_{1-A}Ti_A)O_3$ film toward the $Pb(Zr_{1-x}Ti_x)O_3$ crystal film.

5. An electronic component comprising the ferroelectric ceramics according to claim 1.

6. A method of manufacturing the ferroelectric ceramics according to claim 1, comprising the steps of:

forming a $Pb(Zr_{1-B}Ti_B)O_3$ seed crystal film, by sputtering, on a $Pb(Zr_{1-A}Ti_A)O_3$ film;

coating a solution containing a metal compound wholly or partially containing, in an organic solvent, ingredient metals of the $Pb(Zr_{1-B}Ti_B)O_3$ seed crystal film and a partial polycondensation product thereof onto the $Pb(Zr_{1-B}Ti_B)O_3$ seed crystal film to thereby form a noncrystalline precursor film; and heating the $Pb(Zr_{1-B}Ti_B)O_3$ seed crystal film and the noncrystalline precursor film in an oxygen atmosphere to thereby oxidize and crystallize the noncrystalline precursor film and to thereby form a $Pb(Zr_{1-x}Ti_x)O_3$ crystal film, wherein:

formation of the $Pb(Zr_{1-B}Ti_B)O_3$ seed crystal film is performed by sputtering while the $Pb(Zr_{1-A}Ti_A)O_3$ film is being disposed on an upper side of a sputtering target and the $Pb(Zr_{1-A}Ti_A)O_3$ film is being made to face the sputtering target; and the A, the B and the x satisfy formulae 1 to 3, respectively, below, $$0 \leq A \leq 0.1 \quad \text{formula 1}$$

$$0.1 < B < 1 \quad \text{formula 2}$$

$$0.1 < x < 1 \quad \text{formula 3.}$$

7. The manufacturing method of ferroelectric ceramics according to claim 6, wherein a polarization direction of the $Pb(Zr_{1-B}Ti_B)O_3$ seed crystal film immediately after forming the $Pb(Zr_{1-B}Ti_B)O_3$ seed crystal film by sputtering is identical to a polarization direction of a $Pb(Zr_{1-x}Ti_x)O_3$ crystal film immediately after forming the $Pb(Zr_{1-x}Ti_x)O_3$ crystal film by oxidizing and crystallizing the noncrystalline precursor film.

8. The manufacturing method of ferroelectric ceramics according to claim 6, wherein:

the noncrystalline precursor film is formed by coating a plurality of times the solutions on the $Pb(Zr_{1-B}Ti_B)O_3$ seed crystal film; and in the solutions that are coated the plurality of times, a Zr/Ti ratio in a solution that is coated onto the $Pb(Zr_{1-B}Ti_B)O_3$ seed crystal film from the center of the noncrystalline precursor film in the thickness direction is larger than a Zr/Ti ratio in a solution that is coated onto the side opposite to the $Pb(Zr_{1-B}Ti_B)O_3$ seed crystal film from the center of the noncrystalline precursor film in the thickness direction.

9. The manufacturing method of ferroelectric ceramics according to claim 8, wherein, in the solutions that are coated the plurality of times, a Zr/Ti ratio in each of the solutions for the noncrystalline precursor film in the thickness direction thereof becomes gradually smaller with increase in distance from the $Pb(Zr_{1-B}Ti_B)O_3$ seed crystal film.

10. The manufacturing method of ferroelectric ceramics according to claim 6, wherein, in the $Pb(Zr_{1-B}Ti_B)O_3$ seed crystal film, a Zr/Ti ratio on the $Pb(Zr_{1-x}Ti_x)O_3$ crystal film side from the center in the thickness direction thereof is larger than a Zr/Ti ratio on the $Pb(Zr_{1-A}Ti_A)O_3$ film side from the center in the thickness direction thereof.

11. The manufacturing method of ferroelectric ceramics according to claim 6, wherein a ratio of Pb to (Zr+Ti) in each of the $Pb(Zr_{1-B}Ti_B)O_3$ seed crystal film and the $Pb(Zr_{1-x}Ti_x)O_3$ crystal film satisfies a formula 5 below, $$Pb/(Zr+Ti) < 1.06 \quad \text{formula 5.}$$

* * * * *